(12) United States Patent
Nakada et al.

(10) Patent No.: US 6,762,619 B2
(45) Date of Patent: Jul. 13, 2004

(54) SEMICONDUCTOR INTEGRATED DEVICE AND ELECTRONIC EQUIPMENT

(75) Inventors: Akira Nakada, Chino (JP); Shoichiro Kasahara, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 242 days.

(21) Appl. No.: 10/142,030

(22) Filed: May 10, 2002

(65) Prior Publication Data

US 2002/0173090 A1 Nov. 21, 2002

(30) Foreign Application Priority Data

May 14, 2001 (JP) ........................................ 2001-143632

(51) Int. Cl.[7] .............................................. H03K 17/16
(52) U.S. Cl. .............................. 326/30; 326/86; 326/90; 326/101
(58) Field of Search .............................. 326/30–34, 86, 326/90, 101

(56) References Cited

U.S. PATENT DOCUMENTS 6,362,644 B1 * 3/2002 Jeffery et al.
6,674,302 B2 * 1/2004 Yen .............................. 328/30

* cited by examiner

Primary Examiner—Anh Q. Tran
(74) Attorney, Agent, or Firm—Oliff & Berridge, plc

(57) ABSTRACT

There are provided a semiconductor integrated device capable of achieving stable high-speed data transfer through a differential pair of signal lines and electronic equipment including the semiconductor integrated device. In a signal-transmission period in which current is driven through one of first and second signal lines forming a differential pair, current from a constant current source is caused to flow through a current path to one of a DP pad and DM pad. Current is caused to flow into a DA pad in a period other than the signal-transmission period. A layout arrangement of the current paths from a node ND to which current from the constant current source is supplied to the DP pad and the DM pad is symmetrical. The DA pad is disposed between the DP pad and the DM pad.

31 Claims, 19 Drawing Sheets

US 6,762,619 B2

SEMICONDUCTOR INTEGRATED DEVICE AND ELECTRONIC EQUIPMENT

Japanese Patent Application No. 2001-143632 filed on May 14, 2001, is hereby incorporated by reference in its entirety.

TECHNICAL FIELD

The present invention relates to a semiconductor integrated device and electronic equipment including the same.

BACKGROUND

In recent years, the Universal Serial Bus (USB) has attracted attention as an interface standard for connecting a personal computer with a peripheral device (electronic equipment in a broad sense). The USB has the advantage of enabling peripheral devices such as a mouse, keyboard, and printer, which are conventionally connected through connectors according to different standards, to be connected through the same standard connectors. Moreover, so-called plug & play and hot plug can be realized by the USB.

However, the USB has a problem in which the transfer rate is lower than that of the IEEE 1394, which has also attracted attention as a serial bus interface standard.

To deal with this problem, the USB 2.0 standard enabling a data transfer rate of 480 Mbps (HS mode), which is remarkably higher than that of the USB 1.1, while maintaining backward compatibility with the USB 1.1 standard has been developed and has attracted attention. The UTMI (USB 2.0 Transceiver Macrocell Interface) which defines the interface specification of the physical layer circuits and part of the logical layer circuits of the USB 2.0 has been also developed.

SUMMARY

One aspect of the present invention relates to a semiconductor integrated device which drives current through first and second signal lines forming a differential pair, the semiconductor integrated device comprising:

first and second pads through which current is driven exclusively in a signal-output period, the first and second pads being connected to the first and second signal lines, respectively; and a third pad through which current is driven in a period other than the signal-output period, wherein the third pad is disposed between the first and second pads.

DETAILED DESCRIPTION

Figure 1:
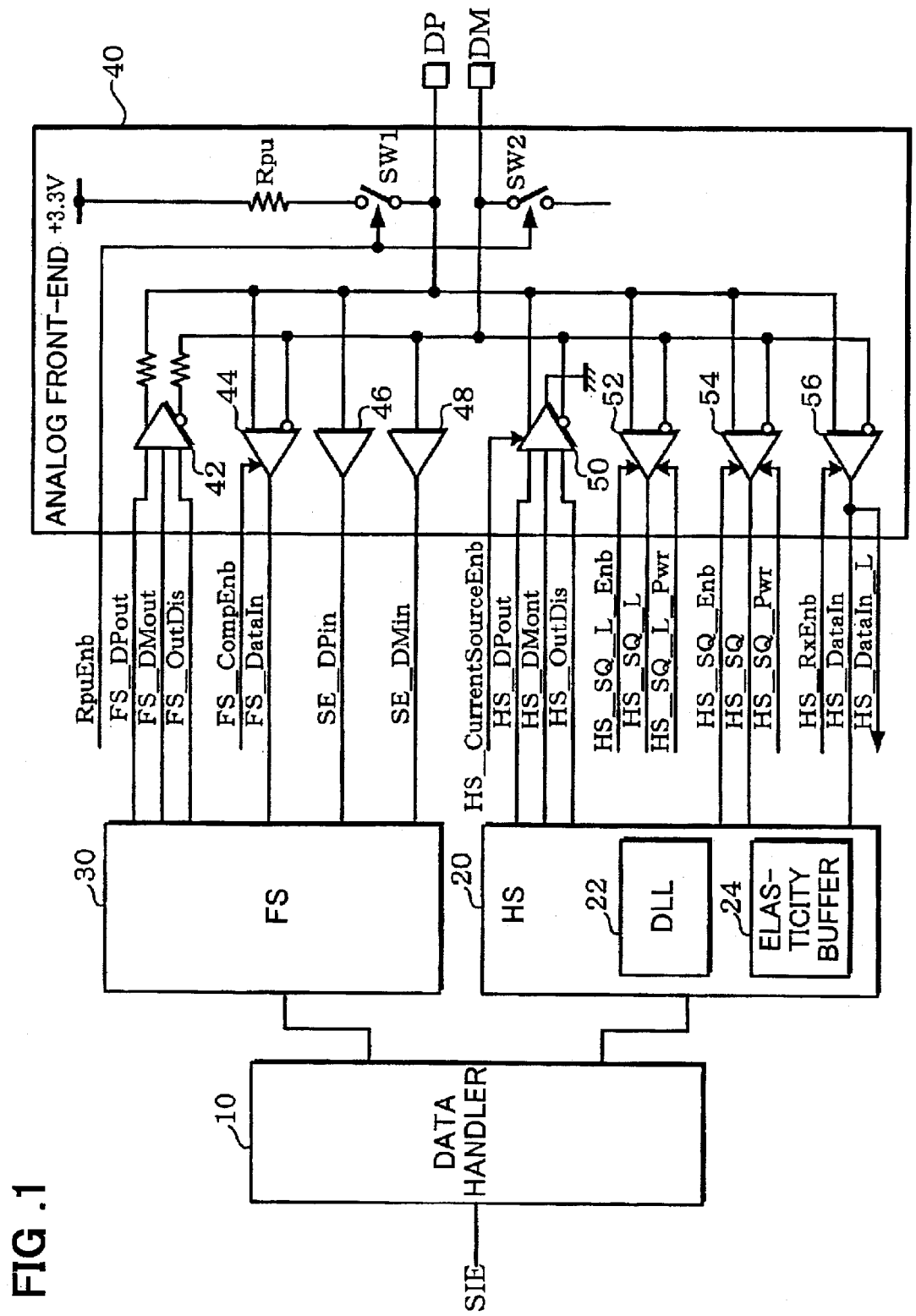
FIG. 1 is configuration diagram showing an example of a configuration of a data transfer control device to which a transmission circuit according to an embodiment of the present invention is applied.

Embodiments of the present invention are described below.

Note that the embodiments described hereunder do not in any way limit the scope of the invention defined by the claims laid out herein. Note also that all of the elements of these embodiments should not be taken as essential requirements to the means of the present invention.

In the USB 2.0, a transfer mode called an HS (High Speed) mode is added to the FS (Full Speed) mode defined in the USB 1.1. Since data is transferred at a rate of 480 Mbps in the HS mode, data transfer remarkably higher than the FS mode, of which transfer rate is 12 Mbps, can be realized. Therefore, the USB 2.0 can provide an interface suitable for storage devices such as hard disk drives and optical disk drives for which a high-speed transfer rate is required.

The USB 2.0 specifies that data transfer in the HS mode is performed by a current driver. However, the USB 2.0 does not specify the configuration of the current driver in detail. With the USB 2.0, it is only described that it is preferable that current from the current driver be allowed to flow continuously in order to stabilize the operation.

Therefore, in the case of driving a differential pair of signal lines by the HS-mode current driver specified by the USB 2.0, it is an important subject to develop a configuration which enables both the specified high-speed data transfer and stable operation.

Following embodiments of the present invention have been achieved in view of the above technical subject. According to the following embodiments, a semiconductor integrated device capable of achieving stable high-speed data transfer through a differential pair of signal lines and electronic equipment including the semiconductor integrated device can be provided.

One embodiment of the present invention provides a semiconductor integrated device which drives current through first and second signal lines forming a differential pair, the semiconductor integrated device comprising:

first and second pads through which current is driven exclusively in a signal-output period, the first and second pads being connected to the first and second signal lines, respectively; and a third pad through which current is driven in a period other than the signal-output period, wherein the third pad is disposed between the first and second pads.

The pads refer to electrodes as connection terminals disposed along the periphery of the semiconductor integrated device, for example. Each pad is associated and electrically connected with each terminal of a package.

According to this embodiment, the third pad through which current is driven in a non-signal-output period which is a period other than the signal-output period is disposed between the first and second pads connected to the first and second signal lines, respectively, through which current is driven exclusively in the signal-output period. Therefore, the distance of transfer of charges stored in interconnects or elements connected to the third pad which is driven in the non-signal-output period can be easily maintained substantially equal to those stored in interconnects or elements connected to the first and second pads which are driven in the signal-output period. Therefore, when the non-signal-output period in which the third pad is driven switches to the signal-output period, charge transfer can be made uniform between these periods, whereby the waveform of the first signal output to one of the first and second signal lines after switching to the signal-output period can be the same as the waveform of the signal before the switching. As a result, the operation of the semiconductor integrated device which performs high-speed signal output to the differential pair of signal lines by driving current can be stabilized.

The semiconductor integrated device may comprise:
a current source connected between a first power supply and a given node;
first and second transistors which electrically connect the node with one of the first and second pads in the signal-output period; and a third transistor which electrically connects the node with the third pad in a period other than the signal-output period.

In this configuration, in the case of driving current through the first and second signal lines forming the differential pair, current from the current source is supplied to the given node, and the current is supplied to the signal line to be transmitted by exclusively controlling the first and second switching transistors connected to the node. The third transistor which is turned on in a period other than the signal-output period is connected to the node so that current from the current source is caused to flow through the third transistor in a period other than the signal-output period. This prevents an increase in the voltage of the node due to the absence of a current path from the current source in a period other than the signal-output period, thereby eliminating a problem in which the level of the first transmission signal when the non-signal-output period switches to the signal-output period is abnormally increased. As a result, transmission operation by driving current can be stabilized.

For example, in the case of performing high-speed signal transmission in which the operation cannot be started nor controlled each time the signal is transmitted by driving current, high-speed signal transmission and stable operation can be achieved at the same time.

The current source may be a constant current source.

When the first and second signal lines are terminated at a given impedance of Z0, the semiconductor integrated device may comprise:

a first load element which is connected between a first transmission signal line connecting the first transistor with the first pad and a second power supply, and has an impedance substantially equal to the impedance Z0; and a second load element which is connected between a second transmission signal line connecting the second transistor with the second pad and a second power supply, and has an impedance substantially equal to the impedance Z0, the first transistor may be inserted between the node and the first pad and has an impedance substantially equal to the impedance Z0/2 when the first transistor is turned on, the second transistor may be inserted between the node and the second pad and has an impedance substantially equal to the impedance Z0/2 when the second transistor is turned on, and the third transistor may be inserted between the node and the third pad and has an impedance substantially equal to the impedance Z0 when the third transistor is turned on.

The value of the given impedance Z0 may be an arbitrary impedance value.

In this configuration, in the case of driving current through the first and second signal lines forming the differential pair, current from the current source is supplied to the given node, and the current is supplied to the first and second pads connected to the signal lines, through which signals are transmitted, by exclusively controlling the first and second transistors connected to the node. The third transistor which is turned on in a period other than the signal-output period is connected to the node so that current from the current source is caused to flow into the third pad through the third transistor in a period other than the signal-output period. When each of the first and second signal lines is terminated at the given impedance Z0, the transistors are formed so that the first transistor has an impedance substantially equal to the impedance Z0/2 when turned on, the second transistor has an impedance substantially equal to the impedance Z0/2 when turned on, and the third transistor has an impedance substantially equal to the impedance Z0 when turned on. The first load element having an impedance substantially equal to the impedance Z0 is connected between the first transmission signal line and the second power supply, and the second load element having an impedance substantially equal to the impedance Z0 is connected between the second transmission signal line and the second power supply.

Therefore, the output impedances of the node to which current from the current source is supplied are terminated at the impedance Z0 in each path through the first to third transistor. Therefore, in the signal-output period and the non-signal-output period, substantially the same impedance may be connected to the node when any of the first to third transistors is turned on. As a result, variation of the voltage of the node to which current from the current source is supplied may be substantially the same, and the waveform of the signal output may be the same in the signal-transmission period, when any of the first to third transistors is turned on.

The semiconductor integrated device may comprise a third load element which is connected between the third transistor and the third pad and has an impedance substantially equal to the impedance Z0/2, and the third transistor may have an impedance substantially equal to the impedance Z0/2 when the third transistor is turned on.

According to this configuration, the impedance of the third transistor is substantially equal to the impedance Z0/2 when turned on, and the third load element having an impedance of Z0/2 is connected between the third transistor and the third pad. Therefore, the output impedances of the node to which current from the current source is supplied are terminated at the impedance Z0 in each path through the first to third transistors. Therefore, effects the same as those of the above configurations can be obtained. Moreover, since each transistor connected to the given node has the same shape, variation of the impedance due to process variation when the transistor is turned on can be absorbed.

In the semiconductor integrated device, the third transistor may have an impedance substantially equal to the impedance Z0/2 when the third transistor is turned on, and the third pad may be terminated at an impedance substantially equal to the impedance Z0/2 outside the semiconductor integrated device.

In this configuration, the impedance of the third transistor is substantially equal to the impedance Z0/2 when turned on, and the third load element having an impedance of Z0/2 is connected to the third pad outside the semiconductor integrated device. Therefore, the output impedances of the node to which current from the current source is supplied are terminated at the impedance Z0 in each path through the first to third transistors. Therefore, effects the same as those of the above configurations can be obtained. Moreover, since each transistor connected to the given node has the same shape, variation of the impedance due to process variation when the transistor is turned on can be absorbed. In addition, since it is unnecessary to provide a load element in the device, the size and cost of the transmission circuit can be reduced.

The semiconductor integrated device may comprise a fourth load element which is connected between a third transmission signal line connecting the third transistor with the third pad and a second power supply, and has an impedance substantially equal to the impedance Z0, the third transistor may have an impedance substantially equal to the impedance Z0/2 when the third transistor is turned on, and the third pad may be terminated at an impedance substantially equal to the impedance Z0 outside the semiconductor integrated device.

In this configuration, the impedance of the third transistor is substantially equal to the impedance Z0/2 when turned on. The fourth load element having an impedance substantially equal to the impedance Z0 is connected between the third transmission signal line and the second power supply. The third pad is terminated at the impedance Z0 outside the semiconductor integrated device. Therefore, the output impedances of the node to which current from the current source is supplied are terminated at the impedance Z0 in each path through the first to third transistors. Therefore, in the signal-output period and the non-signal-output period, substantially the same impedance may be connected to the node when any of the first to third transistors is turned on. As a result, variation of the voltage of the node to which current from the current source is supplied may be substantially the same, and the waveform of the signal output may be the same in the signal-transmission period, when any of the first to third transistors is turned on. Moreover, since each transistor connected to the node has the same shape, variation of the impedance due to process variation when the transistor is turned on can be absorbed. Moreover, since the transistors and interconnects connected to each pad have the same configuration, the number of design steps such as cell appropriation and layout arrangement can be reduced, and the characteristics of signals output from the pads can be easily made uniform.

The semiconductor integrated device may comprise a fifth load element which is inserted between the third transistor and the second power supply and has an impedance substantially equal to the impedance Z0/2, the third transistor may have an impedance substantially equal to the impedance Z0/2 when the third transistor is turned on, and the third pad may be omitted.

In this configuration, the impedance of the third transistor is substantially equal to the impedance Z0/2 when turned on. The node, to which current from the current source is supplied, is terminated by the fifth load element having an impedance Z0/2 and inserted between the third transmission signal line and the second power supply while omitting the third pad. Therefore, the output impedances of the node are terminated at the impedance Z0 in each path through the first to third transistors. Therefore, in the signal-output period and the non-signal-output period, substantially the same impedance may be connected to the node when any of the first to third transistors is turned on. As a result, variation of the voltage of the node to which current from the current source is supplied may be substantially the same, and the waveform of the signal output may be the same in the signal-transmission period, when any of the first to third transistors is turned on. Moreover, since each transistor connected to the node has the same shape, variation of the impedance due to process variation when the transistor is turned on can be absorbed. In addition, the scale and cost of the circuit can be reduced by omitting the third pad.

In the semiconductor integrated device, at least one of the first to third transistors may be an n-type MOS transistor.

According to this configuration, the active direction of a gate signal input to a gate terminal of each transistor can be the same as the active direction of a transmission signal transmitted through each transistor. Therefore, the area of the device can be decreased in comparison with the case of using a p-type MOS transistor. Moreover, noise added to the transmission signal can be removed, whereby a highly reliable transmission signal can be generated.

In the semiconductor integrated device, a first cell including the first transistor connected to the first pad and a second cell including the second transistor connected to the second pad may be disposed so that parasitic loads on an interconnect and a transistor connected to each of the first and second pads are substantially equal between the first and second cells, and the current source may be disposed adjacent to the first and second cells.

In the semiconductor integrated device, the third load element may be disposed between a first cell including the first transistor connected to the first pad and a second cell including the second transistor connected to the second pad.

In the semiconductor integrated device, the fourth load element may be disposed between a first cell including the first transistor connected to the first pad and a second cell including the second transistor connected to the second pad.

In the semiconductor integrated device, the fifth load element may be disposed between a first cell including the first transistor connected to the first pad and a second cell including the second transistor connected to the second pad.

According to these configurations, efficiency of the layout arrangement can be improved by disposing the load elements for adjusting the load balance between the paths to the first and second signal lines forming the differential pair disposed in the semiconductor integrated device.

In the semiconductor integrated device, positions of the first to third pads may be determined so that difference in length among bonding wires connected to the first to third pads is minimum.

According to this configuration, since the output impedances of the node can be maintained substantially equal in the three paths, quality of the level of the output signal can be improved.

In the semiconductor integrated device, a signal transmitted through the first and second signal lines forming the differential pair may be a signal conforming to the Universal Serial Bus (USB) standard.

In this case, a USB 2.0 standard or a standard developed from the USB 2.0 standard may be used as a given interface standard.

Electronic equipment according to another embodiment of the present invention comprises any of the above semiconductor integrated devices, and a device which performs output processing, fetch processing, or storage processing on data transferred through the semiconductor integrated device and a bus.

According to this embodiment, since a semiconductor integrated device capable of performing high-speed data transfer and stable operation can be incorporated into the electronic equipment, performance of the electronic equipment can be improved.

Embodiments of the present invention are described below in detail with reference to the drawings.

1. USB 2.0

According to the USB 2.0, a plurality of peripheral devices compliant with the USB 1.1 or USB 2.0 can be connected to a personal computer as the host machine which manages the bus through a hub device.

A host controller compliant with the USB 2.0 is installed in such a host machine. The host controller judges whether the connected device is compliant with either the USB 1.1 or USB 2.0 and controls data transfer through the bus.

A hub controller compliant with the USB 2.0 is installed in the hub device, for example. The hub controller judges whether the device to be connected is compliant with either the USB 1.1 or USB 2.0 and controls the bus transfer mode.

A device controller compliant with the USB 1.1 or USB 2.0 is installed in the peripheral devices. When the device controller is compliant with the USB 2.0, the device controller includes a physical layer circuit compliant with the USB 1.1 and USB 2.0 interface standards, and a logical layer circuit which controls data transfer corresponding to the peripheral device to be installed.

A semiconductor integrated device according to the following embodiments may be applied to the host controller, hub controller, and device controller including the above physical layer circuit (data transfer control device in a broad sense). The semiconductor integrated device according to the following embodiments is not limited to the application for various types of controllers specified by the USB 2.0 insofar as the semiconductor integrated device outputs a signal to a differential pair of signal lines.

2. Semiconductor Integrated Device (Data Transfer Control Device)

FIG. 1 shows an example of configuration of a data transfer control device to which the semiconductor integrated device according to the following embodiments is applied.

This data transfer control device includes a logical layer circuit and a physical layer circuit.

The logical layer circuit includes a data handler circuit 10, an HS (High Speed) circuit 20, and an FS (Full Speed) circuit 30. The physical layer circuit includes an analog front-end circuit 40. The data transfer control device does not necessary include all the circuit blocks shown in FIG. 1. Some of the circuit blocks may be omitted.

The data handler circuit (given circuit for transferring data in a broad sense) 10 performs various types of transmission processing and reception processing for data transfer according to the USB 2.0, More specifically, the data handler circuit performs processing for adding SYNC (SYNChronization), SOP (Start Of Packet), and EOP (End Of Packet) to transmission data, bit stuffing processing, and the like at the time of transmitting data. Upon receiving data, the data handler circuit performs processing f or detecting and deleting the SYNC, SOP, and EOP of the received data, bit unstuffing processing, and the like. The data handler circuit 10 also performs processing for generating various types of timing signals for controlling transmission and reception of data. The data handler circuit 10 is connected to an SIE (Serial Interface Engine).

The SIE includes an SIE control logic for identifying a USB packet ID and address, and an endpoint logic for performing endpoint processing such as identification of an endpoint number and FIFO control.

The HS circuit 20 is a logic circuit for transmitting and receiving data in the HS (High Speed) mode in which the data transfer rate is 480 Mbps.

The FS circuit 30 is a logic circuit for transmitting and receiving data in the FS (Full Speed) mode in which the data transfer rate is 12 Mbps.

The analog front-end circuit 40 is an analog circuit including drivers and receivers for transmitting and receiving data in the FS mode and the HS mode. In the USE, data is transmitted and received using a differential pair of signals using DP (Data+) and DM (Data−).

This data transfer control device further includes a clock circuit (not shown) for generating a clock signal at 480 MHz used in the HS circuit 20 and a clock signal at 60 MHz used in the device and the SIE, and a control circuit (not shown) for generating various types of control signals of the analog front-end circuit 40.

The HS circuit 20 includes a DLL (Delay Line PLL) circuit 22 and an elasticity buffer 24.

The DLL circuit 22 generates a data sampling clock based on a clock generated from a clock circuit (not shown) and a received signal.

The elasticity buffer 24 is a circuit for absorbing the difference in clock frequency (clock drift) between inside the device and external devices (external devices connected to the bus) and the like.

The USB 2.0 defines the HS mode and the FS mode as the transfer modes. The HS mode is additionally defined in the USB 2.0. The FS mode has been defined in the USB 1.1.

In the HS mode, data is transmitted and received between the data handler circuit 10 and the analog front-end circuit 40 through the HS circuit 20.

In the FS mode, data is transmitted and received between the data handler circuit 10 and the analog front-end circuit 40 through the FS circuit 30.

Therefore, HS-mode drivers and receivers and FS-mode drivers and receivers for transmitting and receiving DP and DM, a differential pair of transmission and reception signals, are separately provided to the analog front-end circuit 40.

More specifically, the analog front-end circuit 40 includes an FS driver 42, FS differential data receiver 44, SE (Single Ended)_DP receiver 46, SE_DM receiver 48, HS current driver (transmission circuit in a broad sense) 50, low-speed HS_SQ (SQuelch)_L circuit 52, high-speed HS_SQ circuit 54, and HS differential data receiver 56.

The FS driver 42 outputs a differential pair of transmission signals consisting of FS_DPout and FS_DMout from the FS circuit 30 as the differential pair of transmission signals consisting of DP and DM in the FS mode. The output of the FS driver 42 is controlled by FS_OutDis from the FS circuit 30.

The FS differential data receiver 44 amplifies the differential pair of received signals DP and DM and outputs FS_DataInto the FS circuit 30 in the FS mode. The amplification of the FS differential data receiver 44 is controlled by FS_CompEnb.

The SE_DP receiver 46 amplifies the single ended received signal DP and outputs SE_DPin to the FS circuit 30 in the FS mode.

The SE_DM receiver 48 amplifies the received single ended signal DM and outputs the signal as SE_DMin to the FS circuit 30 in the FS mode.

The HS current driver 50 amplifies the differential pair of signals HS_DPout and HS_DMout from the HS circuit 20 and outputs the differential pair of signals DP and DM in the HS mode. The output of the HS current driver 50 is controlled by HS_OutDis from the HS circuit 20. The drive current of the HS current driver 50 is controlled by HS_CurrentSourceEnb.

The low-speed HS_SQ_L circuit 52 precisely detects the presence or absence of the differential pair of received signals DP and DM and outputs HS_SQ_L as the signal detection results. The operation of the low-speed HS_SQ_L circuit 52 is controlled by HS_SQ_L_Enb. The power consumption of the low-speed HS_SQ_L circuit 52 is controlled by HS_SQ_L_Pwr.

The high-speed HS_SQ circuit 54 detects the presence or absence of the differential pair of received signals DP and DM and outputs HS_SQ to the HS circuit 20 as the signal detection results. The operation of the high-speed HS_SQ circuit 54 is controlled by HS_SQ_Enb from the HS circuit 20. The power consumption of the high-speed HS_SQ circuit 54 is controlled by HS_SQ_Pwr.

The HS differential data receiver 56 amplifies the differential pair of received signals DP and DM and outputs HS_DataIn and HS_DataIn _L in the HS mode. The amplification of the HS differential data receiver 56 is controlled by HS_RxEnb.

The DP of the differential pair of transmission and reception signals DP and DM is (electrically) connected to a power supply voltage of 3.3 V through an SWA and a pull-up resistor Rpu. The DM of the differential pair of transmission and received signals is connected to an SWB. The SWA and SWB are controlled by RpuEnb. Taking the load balance into consideration, the DM may be connected to a resistance equivalent to the pull-up resistor Rpu through the SWB. RpuEnb at least allows the DP to be connected to the pull-up resistor Rpu through the SWA in the FS mode.

The data transfer control device includes the drivers and receivers corresponding to the transfer rates in the HS mode and the FS mode as described above.

2.1 Configuration of Transmission/Reception System

Figure 2:
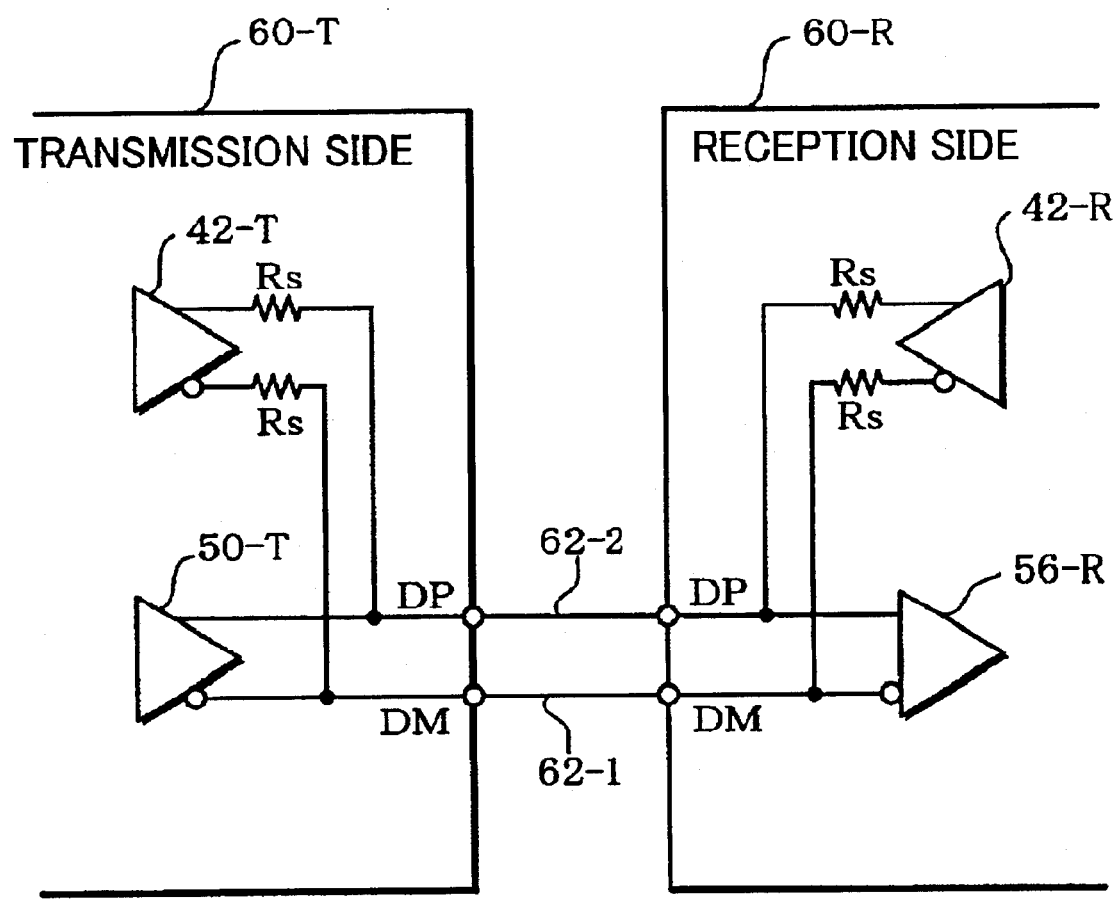
FIG. 2 is a configuration diagram showing an example of a main part of a transmission and reception system in the case of transferring data in the HS mode.

FIG. 2 shows an example of main parts of a transmission/reception system in the case of transferring data in the HS mode using the data transfer control device shown in FIG. 1.

In the case of transferring data in the HS mode, a data transfer control device 60-T on the transmission side and a data transfer control device 60-R on the reception side including the above physical layer circuit are connected through a differential pair of signal lines (first and second signal lines in a broad sense) 62-1 and 62-2, through which the differential pair of transmission and reception signals DP and DM are transferred.

According to the USB 2.0, the drivers and receivers corresponding to the transfer rates in HS-mode and the FS-mode are separately provided as described above. Therefore, the drivers and receivers in each mode are connected in common with the differential pair of signal lines (first and second signal lines 62-1 and 62-2).

The analog front-end circuit of the data transfer control device 60-T on the transmission side includes at least an FS driver 42-T and an HS current driver 50-T. The analog front-end circuit of the data transfer control device 60-R on the reception side includes at least an FS driver 42-R and an HS differential data receiver 56-R.

The USB 2.0 specifies an output impedance of Z0 (45 Ω±10%) at the time of data transfer in the HS mode. Termination resistors having an impedance of Rs equivalent to this output impedance are connected to each of the first and second signal lines 62-1 and 62-2 in the data transfer control devices.

The termination resistors are connected to the FS driver. Therefore, when the FS driver drives "0" in the HS mode, the termination resistors are used as termination resistors of the signal lines in the HS mode.

The FS driver 42-T drives "0" through the first and second signal lines 62-1 and 62-2 by the output control using FS_OutDis shown in FIG. 1, for example. As a result, the first and second signal lines 62-1 and 62-2 are pulled down through the termination resistors in the data transfer control device 60-R on the transmission side.

The HS current driver 50-T amplifies the differential pair of transmission signals consisting of HS_DPout and HS_DMout from the HS circuit (not shown) by the output control using HS_OutDis and the supply control of drive current using HS_CurrentSourceEnb shown in FIG. 1, for example.

The FS driver 42-R drives "0" through the first and second signal lines 62-1 and 62-2 by the output control using FS_OutDis shown in FIG. 1, for example. As a result, the first and second signal lines 62-1 and 62-2 are pulled down through the termination resistors in the data transfer control device 60-R on the reception side.

The HS differential data receiver 56-R amplifies the differential pair of received signals through the first and second signal lines 62-1 and 62-2 by the output control using HS_RxEnb shown in FIG. 1, and outputs HS_DataIn and HS_DataIn_L, for example.

The HS current driver 50-T of the data transfer control device 60-T on the transmission side drives current through the first and second signal lines 62-1 and 62-2 terminated by the termination resistors on the transmission side and the reception side corresponding to the transmission signal.

3. Transmission circuit 3.1 Current Path

Figure 3:
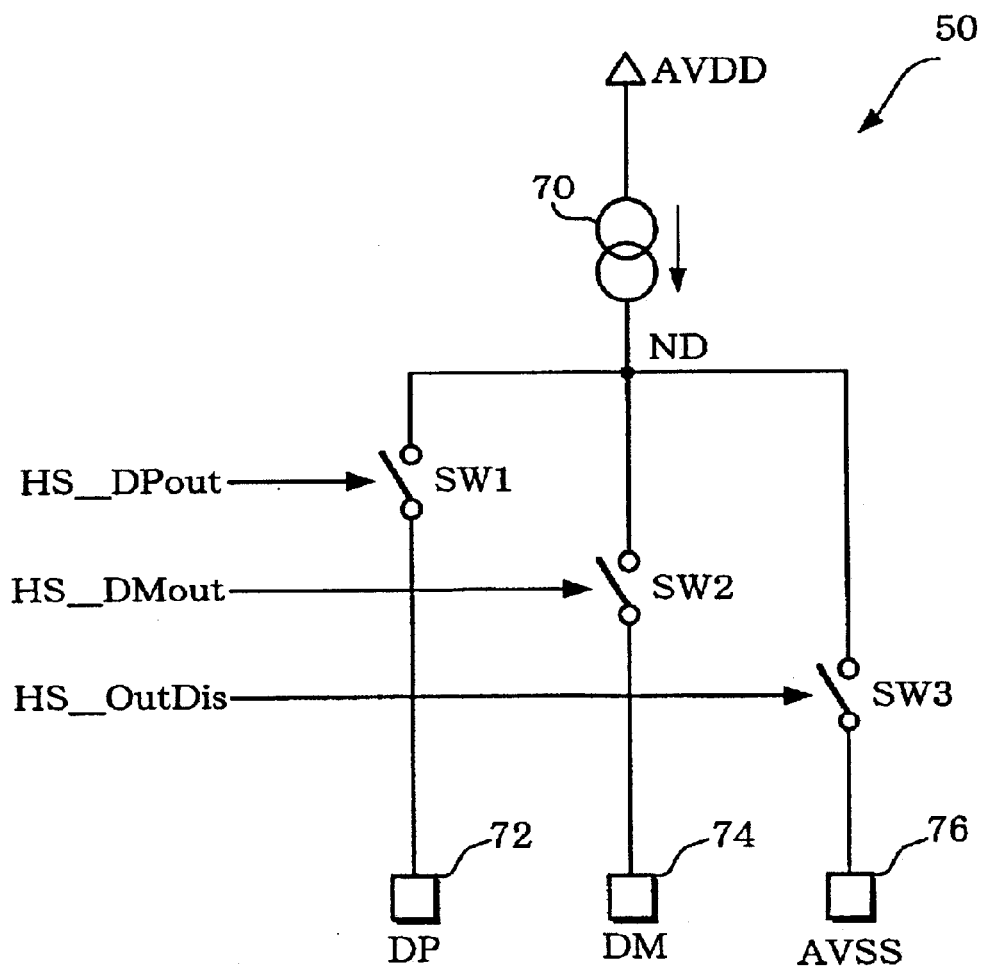
FIG. 3 is a configuration diagram showing an outline of a configuration of an HS current driver.

FIG. 3 shows an outline of the configuration of the HS current driver.

The HS current driver 50 includes a current source 70 connected between a first power supply AVDD and a node ND, and switching devices SW1 to SW3 connected to the node ND on one end. The other end of the switching device SW1 is connected to a DP terminal (connection terminal in a broad sense) 72. The other end of the switching device SW2 is connected to a DM terminal 74. The other end of the switching device SW3 is connected to a DA terminal 76. The DA terminal 76 is connected to a second power supply AVSS either inside or outside the circuit.

When the HS current driver is integrated in the semiconductor integrated device, one of a DP pad as the DP terminal 72, a DM pad as the DM terminal 74, and a DA pad (or AVSS pad) as the DA terminal 76 is electrically connected with the current source 70. The pads refer to electrodes as the connection terminals disposed along the periphery of the semiconductor integrated device, for example. Each pad is associated with each terminal of a package and electrically connected therewith.

The HS current driver 50 is designed so that current from the current source 70 flows into one of the DP terminal 72, DM terminal 74, and DA terminal 76 by exclusively controlling the switching devices SW1 to SW3.

More specifically, in the case of transmitting DP "1", the HS current driver 50 turns on the switching device SW1 using HS_DPout and turns off the switching devices SW2 and SW3, thereby causing current from the current source 70 to flow into the DP terminal 72.

In the case of transmitting DM "1", the HS current driver 50 turns on the switching device SW2 using HS_DMout and turns off the switching devices SW1 and SW3, thereby causing current from the current source 70 to flow into the DM terminal 74.

In a non-signal-transmission period (non-signal-output period in a broad sense) other than a signal-transmission period (signal-output period in a broad sense) of DP "1" or DM "1", the HS current driver 50 turns on the switching device SW3 using HS_OutDis and turns off the switching devices SW1 and SW2, thereby causing current from the current source 70 to flow into the DA terminal 76.

This prevents an increase in the voltage of the node ND occurring when providing no current path from the current source 70 in the non-signal-transmission period.

Figure 4:
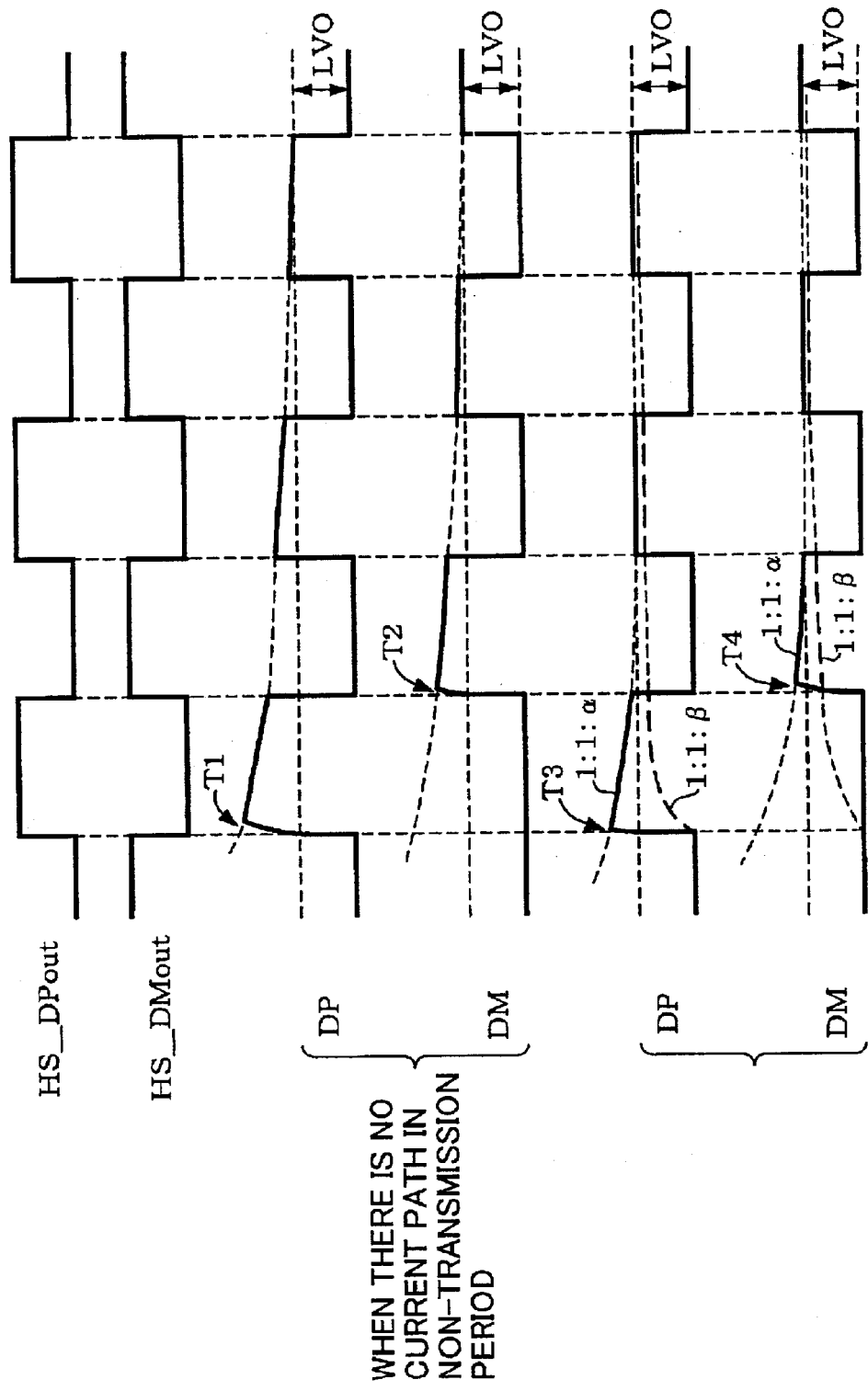
FIG. 4 is an explanatory diagram showing an example of waveforms of a differential pair of transmission signals transmitted by the HS current driver.

FIG. 4 shows an example of waveforms of the differential pair of transmission signals transmitted by the HS current driver.

As shown in FIG. 3, HS_DPout and HS_DMout which perform logic operation exclusively in a state in which both edges are aligned are supplied to the HS current driver 50 from the HS circuit (not shown).

Generally, it is possible to control start and termination of the operation of the current source 70. However, since stabilization of the operation of the current source 70 requires a considerable period of time, it is difficult to start or terminate the operation of the current source 70 each time the data is transmitted in the case of performing high-speed transfer in the HS mode. Therefore, it is necessary to cause current to flow continuously from the current source 70 in order to ensure stable operation of the current source 70.

When the current is continuously supplied from the current source 70, if there is no current path through the switching device SW3 in the non-signal-transmission period, the voltage of the node ND is increased due to current continuously flowing from the current source 70.

At this time, when the switching device SW1 is turned on by HS_DPout indicated by T1 in FIG. 4, the voltage of the DP exceeds a specified level of LV0. Specifically, a problem occurs in which the voltage of the DP output by HS_DPout is increased at the first T1 when the non-signal-transmission period switches to the signal-transmission period. The voltage of the DP reaches the voltage LV0 which should be output in the signal-transmission period with the passage of time.

This also applies to the DM. When the switching device SW2 is turned on by HS_DMout at a T2 after the T1, the voltage of the DM may exceed the specified level LV0. The voltage of the DM reaches the voltage LV0 which should be output during the signal-transmission period with the passage of time.

In FIG. 3, an increase in the voltage of the node ND in the non-signal-transmission period is prevented by causing current from the current source 70 to flow into the DA terminal through the switching device SW3 in the non-signal-transmission period. This prevents the output level of the first transmission signal at the time of switching to the signal-transmission period from the non-signal-transmission period from exceeding the specified level, thereby stabilizing the operation.

3.2 Impedance

In the case of driving current through the first and second signal lines 62-1 and 62-2 by the HS current driver 50, the level of the transmission signal is determined depending upon the impedance from the node ND to the receiving end.

An impedance from the node ND to the receiving end through the switching device SW1 and the first signal line 62-1 is referred to as Zp, an impedance from the node ND to the receiving end through the switching device SW2 and the second signal line 62-2 is referred to as Zm, and an impedance from the node ND to the second power supply AVSS through the switching device SW3 and the DA terminal 74 is referred to as Za.

Even if the current path to the DA terminal in the non-signal-transmission period is provided, the voltage of the node ND is increased when "Zp:Zm:Za=1:1:$\alpha$" (1<$\alpha$) since the impedance of the current path to the DA terminal is high. At this time, when the switching device SW1 is turned on by HS_DPout indicated by a T3 in FIG. 4, the voltage of the DP may exceed the specified level LV0. This causes a problem in which the voltage of the DP output by HS_DPout is increased at the first T3 when switching to the signal-transmission period from the non-signal-transmission period. The voltage of the DP reaches the voltage LV0 which should be output in the signal-transmission period with the passage of time.

This also applies to the DM. When the switching device SW2 is turned on by HS_DMout at a T4 after the T3, the voltage of DM may exceed the specified level LV0. The voltage of the DM reaches the voltage LV0 which should be output in the signal-transmission period with the passage of time.

Even if the current path to the DA terminal in the non-signal-transmission period is provided, the voltage of the node ND is decreased when "Zp:Zm:Za=1:1:β" (0<β<1) since the impedance of the current path to the DA terminal is low. At this time, when the switching device SW1 is turned on by HS_DPout indicated by the T3 in FIG. 4, the voltage of the DP does not reach the specified level LV0. This causes a problem in which the voltage of the DP output by HS_DPout is decreased at the first T3 when switching to the signal-transmission period from the non-signal-transmission period, whereby the transmission signal may not be detected normally at the receiving end. The voltage of the DP reaches the voltage LV0 which should be output in the signal-transmission period with the passage of time.

This also applies to the DM. When the switching device SW2 is turned on by HS_DMout at the T4 after the T3, the voltage of the DM may not reach the specified level LV0. The voltage of the DM reaches the voltage LV0 which should be output in the signal-transmission period with the passage of time.

If the impedance of each current path from the node ND is nonuniform, not only does the level of the signal output through each path become nonuniform, but also the voltage of the node ND varies.

The first and second signal lines 62-1 and 62-2 have an impedance of Z0 specified by the termination resistors on the transmission side and the reception side and the resistance of the signal lines as described above. In FIG. 3, the impedance of the path through which current from the current source 70 flows to the DA terminal through the switching device SW3 in the non-signal-transmission period is made substantially equal to this impedance in order to make the impedance of each current path substantially equal.

3.3 Layout Arrangement

In such a data transfer control device, it is preferable that at least the current paths to the first and second signal lines 62-1 and 62-2 driven by the HS current driver be symmetrical. This enables the load balance between the paths to the DP terminal and the DM terminal to be maintained. As a result, the signal waveforms output to the first and second signal lines 62-1 and 62-2 in the signal-transmission period can be made equal.

The switching device SW3 for allowing current from the current source 70 to flow into the DA terminal in the non-signal-transmission period is preferably at an equal distance from the switching devices SW1 and SW2 for allowing current from the current source 70 to flow in the signal-transmission period. This ensures that charge transfer of the node ND can be made uniform between the switching devices SW1 and SW2 when the non-signal-transmission period switches to the signal-transmission period. As a result, even if the first signal when switching to the signal-transmission period from the non-signal-transmission period is output through one of the switching device SW1 and SW2, the signal waveform can be made equivalent.

Therefore, in the data transfer control device (semiconductor integrated device), the layout arrangement of two paths (SW1 and SW2) in which the current path is formed in the signal-transmission period is symmetrical so that parasitic load such as a resistance component and capacitance component on the paths to the first and second signal lines forming the differential pair becomes substantially equal regardless of process variation. This enables noise added to the transmission and reception signals which operate as the differential pair to be offset with high precision.

In the case of arranging the layout of each path to the differential pair of signal lines, each path is celled and disposed mirror-symmetrically. One path (SW3) in which the current path is formed in a period other than the signal-transmission period is disposed between these cells so that the signal waveforms of the DP and DM become equivalent when switching to the signal-transmission period from the non-signal-transmission period. This improves efficiency of the layout arrangement.

3.4 Pad position

In the case of providing the DP terminal 72 and the DM terminal 74, to which the first and second signal lines 621 and 62-2 forming the differential pair are connected, as the DP pad and the DM pad on a semiconductor substrate, it is preferable to dispose these pads approximately at the center of the substrate so that the load balance to the corresponding terminals of the package becomes uniform.

This enables a decrease in the parasitic load from the DP and DM pads to the corresponding terminals of the package through bonding wire and the load balance to be maintained, whereby reliability of the transmission and reception signals can be improved by making the signal waveforms equivalent.

Figure 5A:
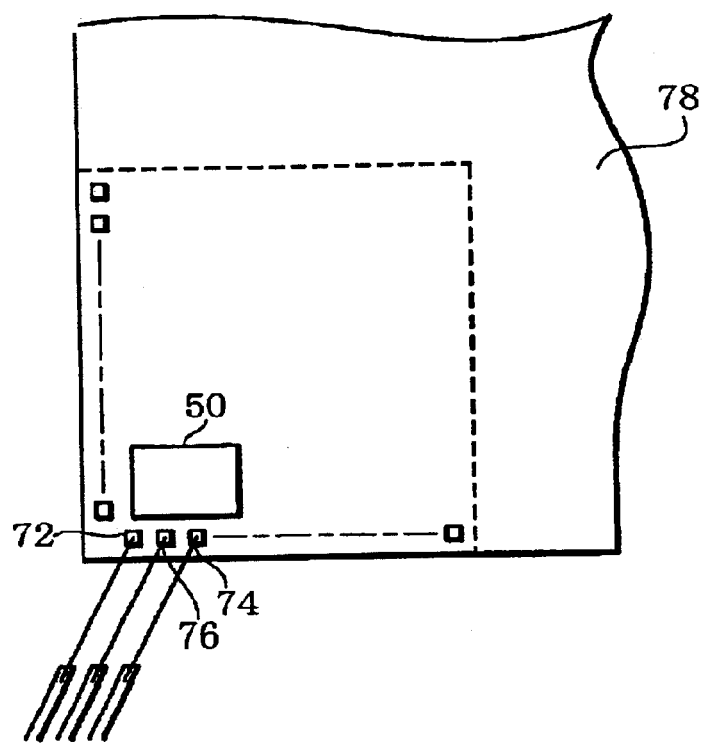
FIG. 5A is an explanatory diagram for describing load balance in the case of disposing pads near the corner section of a substrate.

When the DP pad 72, DM pad 74, and DA pad 76 are disposed near the corner section of a semiconductor substrate 78 as shown in FIG. 5A, the parasitic load from the pads to the terminals of the package is increased taking into consideration the length of leads by packaging. The load balance between the DP pad 72 and the DM pad 74 may be impaired due to the difference in the length of the bonding wire and the leads.

Figure 5B:
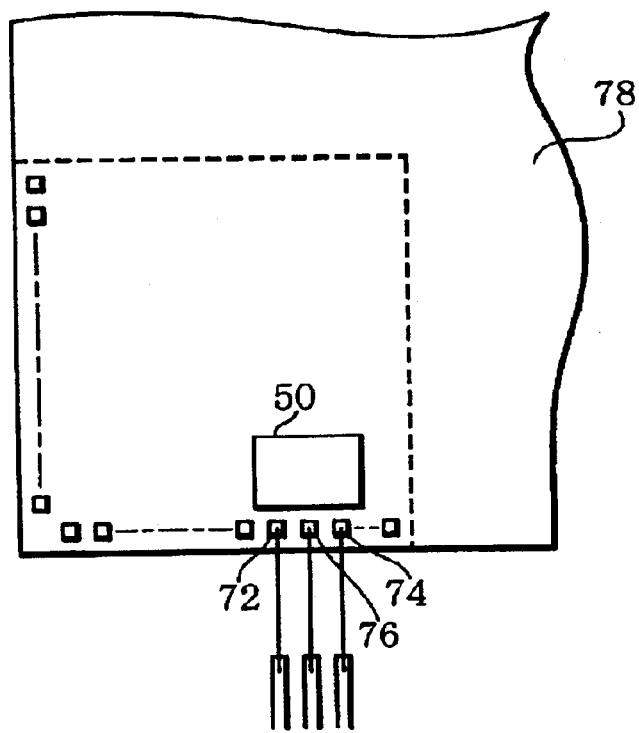
FIG. 5B is an explanatory diagram for describing the load balance in the case of disposing pads near the center of the substrate.

On the contrary, when the DP pad 72, DM pad 74, and DA pad 76 are disposed near the center of the semiconductor substrate 78 as shown in FIG. 5B, since the length of the leads by packaging is decreased in comparison with the case shown in FIG. 5A, the parasitic load from the pads to the terminals of the package can be decreased. Moreover, since the difference in the length of the bonding wire and the leads can be eliminated, the load balance can be maintained substantially equal between the DP pad 72 and the DM pad 74.

Because it is necessary to take into consideration the load balance not only for the DP pad and DM pad but also for the DA pad, it is preferable to dispose these three pads at a position so that the load balance of the signal lines connected to the pads becomes uniform.

Data transfer in the HS mode can be realized by configuring the HS current driver in this manner, for example. Moreover, the operation of the current source needed therefor is stabilized, whereby stable high-speed data transfer can be achieved.

3.5 Configuration example of transmission circuit

A transmission circuit which can be applied to such an HS current driver and a data transfer control device including the transmission circuit are described below in detail.

First Embodiment

Figure 6:
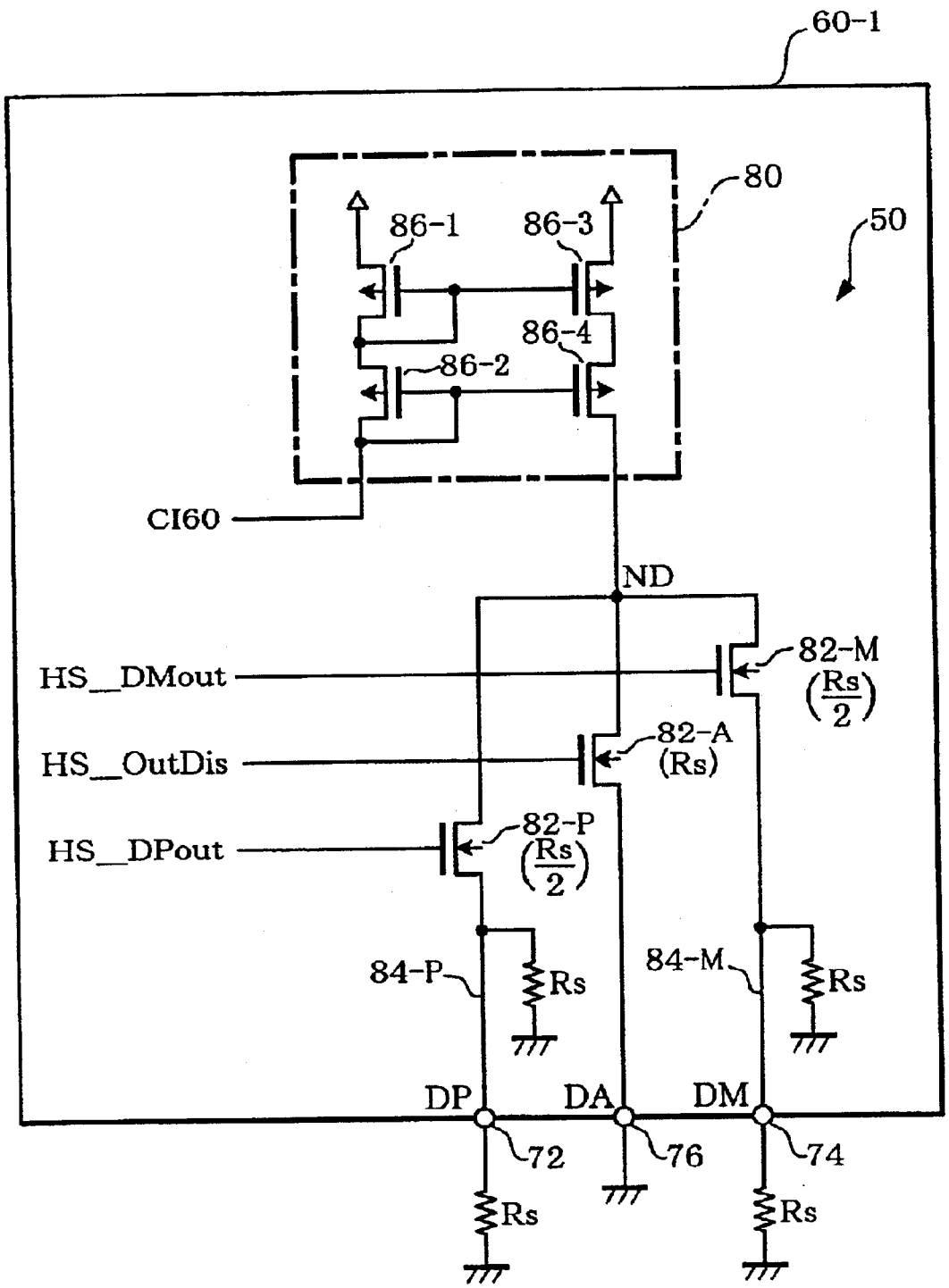
FIG. 6 is a configuration diagram showing an example of configuration of a transmission circuit of a first embodiment.

FIG. 6 shows a configuration example of a transmission circuit of the first embodiment.

The transmission circuit 50 of the first embodiment transmits a signal conforming to the USB 2.0 in a data transfer control device 60-1. The data transfer control device 60-1 includes the DP terminal 72, DM terminal 74, and DA terminal 76.

The DP terminal 72 is electrically connected to the first signal line 62-1 which makes up the differential pair of signal lines. The DM terminal 74 is electrically connected to the second signal line 62-2 which makes up the differential pair of signal lines. The DA terminal 76 is electrically connected to the second power supply AVSS.

The transmission circuit 50 includes a constant current source 80, an n-type MOS transistor 82-P as the switching device SW1, an n-type MOS transistor 82-M as the switching device SW2, and an n-type MOS transistor 82-A as the switching device SW3.

The operation of the constant current source 80 is controlled by a current source control signal CI60. The constant current source 80 supplies current with a given constant current value corresponding to the current value of the current source control signal CI60 to the node ND.

The node ND is connected to source terminals of the n-type MOS transistors 82-P, 82-M, and 82-A.

A drain terminal of the n-type MOS transistor 82-P is connected to the DP terminal 72, and HS_DPout from the HS circuit is supplied to a gate terminal of the n-type MOS transistor 82-P.

A drain terminal of the n-type MOS transistor 82-M is connected to the DM terminal 74, and HS_DMout from the HS circuit is supplied to agate terminal of the n-type MOS transistor 82-M.

A drain terminal of the n-type MOS transistor 82-A is connected to the DA terminal 76, and HS OutDis from the HS circuit is supplied to a gate terminal of the n-type MOS transistor 82-A.

A first transmission signal line 84-P which electrically connects the drain terminal of the n-type MOS transistor 82-P to the DP terminal 72 is terminated by the termination resistor of the FS driver as described above. Therefore, a resistance element having an impedance of Rs is schematically connected between the first transmission signal line 84-P and the second power supply AVSS in FIG. 6.

A second transmission signal line 84-M which electrically connects the drain terminal of the n-type MOS transistor 82-M to the DM terminal 74 is terminated by the termination resistor of the FS driver as described above. Therefore, a resistance element having an impedance of Rs is schematically connected between the second transmission signal line 84-M and the second power supply AVSS in FIG. 6.

In the first embodiment, the n-type MOS transistors 82-P and 82-M are formed in the shape whereby the impedances of the n-type MOS transistors 82-P and 82-M are Rs/2 when turned on by HS_DPout and HS_DMout, respectively.

The n-type MOS transistor 82-A is formed in the shape whereby the impedance of the n-type MOS transistor 82-A is Rs when turned on by HS OutDis.

The channel width of the n-type MOS transistor 82-P is referred to as Wp, the channel width of the n-type MOS transistor 82-M is referred to as Wm, and the channel width of the n-type MOS transistor 82-A is referred to as Wa. Transistors having the above impedances can be easily realized by achieving the impedance Rs/2 by the channel width Wp (Wm) while allowing the channel length L of each transistor to be uniform and adjusting "Wp:Wm:Wa" to "1:1:0.5", for example.

The constant current source 80 is a two-stage current mirror circuit including p-type MOS transistors 86-1 to 86-4.

Specifically, a source terminal of the p-type MOS transistor 86-1 is connected to the first power supply AVDD, and a drain terminal of the p-type MOS transistor 86-1 is connected to a source terminal of the p-type MOS transistor 86-2. A gate terminal and the drain terminal of the p-type MOS transistor 86-1 are connected with each other. A gate terminal and a drain terminal of the p-type MOS transistor 86-2 are connected with each other.

The current source control signal CI60 is supplied to the drain terminal of the p-type MOS transistor 86-2.

A source terminal of the p-type MOS transistor 86-3 is connected to the first power supply AVDD, and a drain terminal of the p-type MOS transistor 86-3 is connected to a source terminal of the p-type MOS transistor 86-4. A gate terminal of the p-type MOS transistor 86-3 is connected to the gate terminal of the p-type MOS transistor 86-1. A gate terminal of the p-type MOS transistor 86-4 is connected to the gate terminal of the p-type MOS transistor 86-2.

A drain terminal of the p-type MOS transistor 86-4 is connected to the node ND.

The constant current source 80 can generate stable current with a constant current value due to the two-stage current mirror structure. The constant current source 80 supplies current with a constant current value with a given mirror ratio to the current value supplied by the current source control signal CI60 to the node ND.

In the transmission circuit having the above configuration, the impedances of the current paths through the n-type MOS transistors 82-P, 82-M, and 82-A from the node ND are substantially equal to Rs.

Specifically, in the case of transmitting DP "1", constant current supplied to the node ND is driven through the impedance Rs from the node ND by turning on the n-type MOS transistor 82-P by HS_DPout.

In the case of transmitting DM "1", constant current supplied to the node ND is driven through the impedance Rs from the node ND by turning on the n-type MOS transistor 82-M by HS_DMout.

In the non-signal-transmission period in which "0" is transmitted to the DP and DM, constant current supplied to the node ND is driven through the impedance Rs from the node ND by turning on the n-type MOS transistor 82-A.

Therefore, data transfer in the HS mode can be realized by adjusting the impedance Rs to the output impedance of the HS current driver specified by the USB 2.0.

Figure 7:
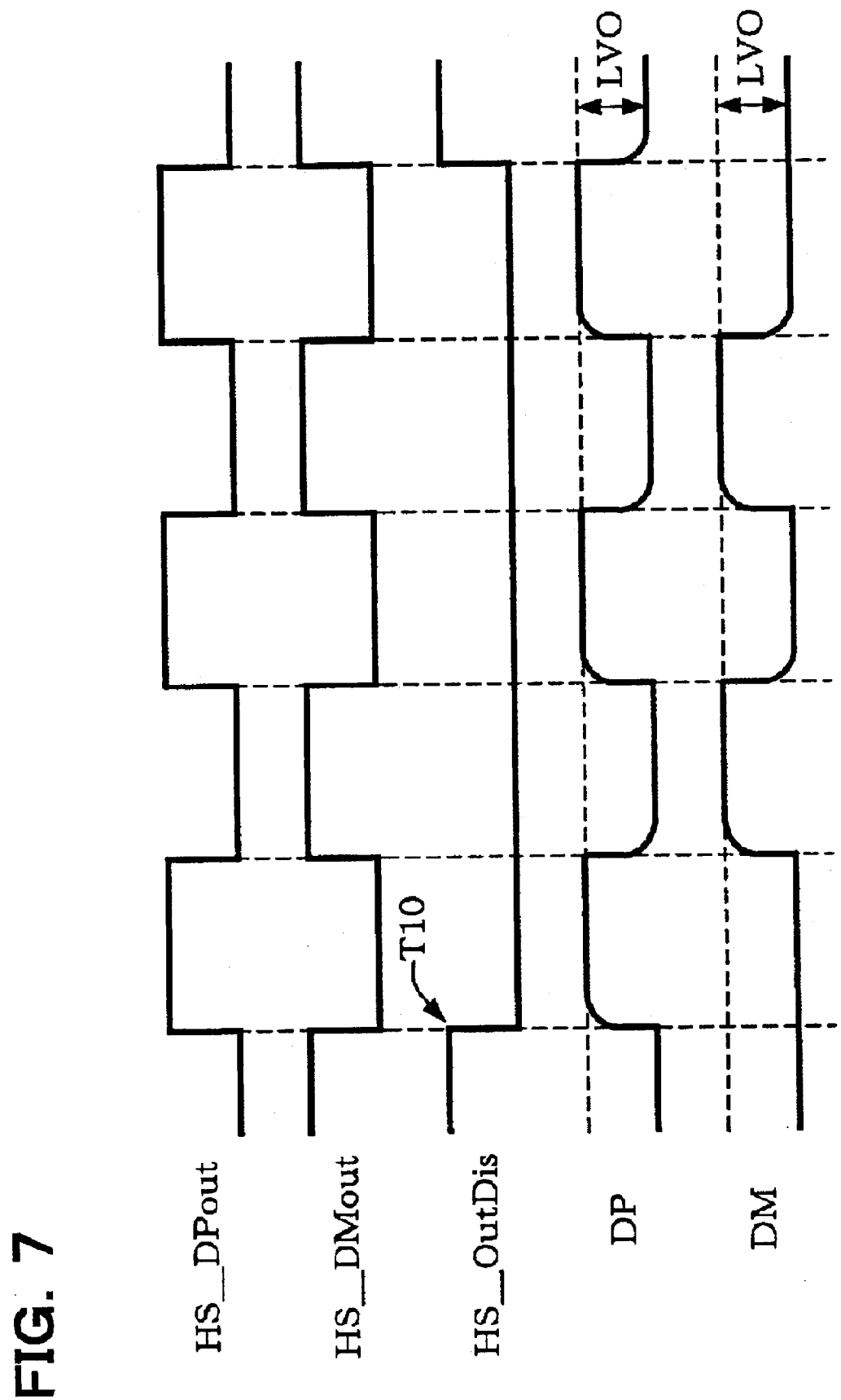
FIG. 7 is an explanatory diagram showing an example of waveforms of a differential pair of transmission signals transmitted by the transmission circuit of the first embodiment.

FIG. 7 shows an example of waveforms of the differential pair of transmission signals transmitted by the transmission 15 circuit of the first embodiment.

The transmission circuit of the first embodiment is formed so that the impedances of the current paths from the node ND are substantially equal by providing the current path for the constant current source in the non-signal-transmission period as described above. This ensures that the voltage of the DP output by HS_DPout at a first T10 when switching to the signal-transmission-period from the non-signal-transmission period is output at the level LV0 which should be output in the signal-transmission-period, thereby eliminating a problem in which a nonstandardized signal level is output.

One of the features of the first embodiment is that the n-type MOS transistors are used as the switching devices, as shown in FIG. 6.

Figure 8A:
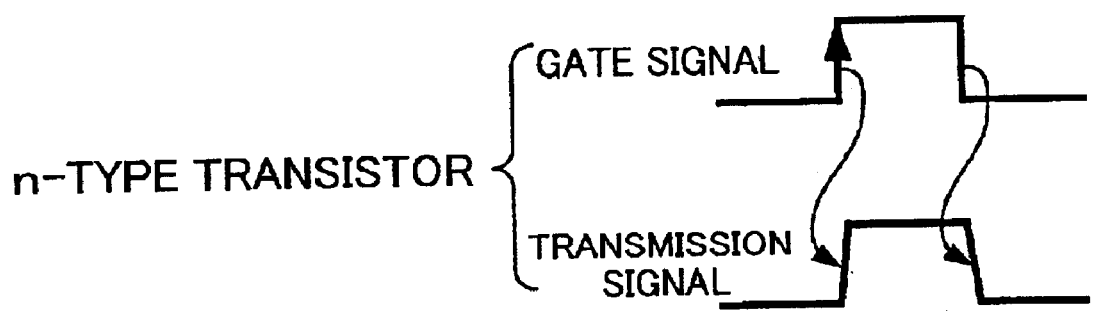
FIG. 8A is an explanatory diagram schematically showing the outline of the waveform of a transmission signal in the case of using an n-type MOS transistor as a switching device.
Figure 8B:
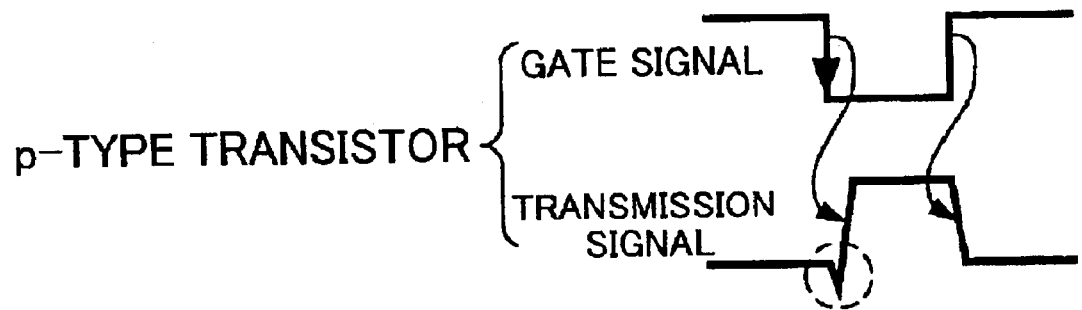
FIG. 8B is an explanatory diagram schematically showing the outline of the waveform of the transmission signal in the case of using an p-type MOS transistor as the switching device.

FIGS. 8A and 8B schematically show outlines of the waveforms of the transmission signals in the case of using an n-type MOS transistor and a p-type MOS transistor as the switching device.

As shown in FIG. 8A, in the case of using the n-type MOS transistor as the switching device, the active direction of the gate signal (HS_DPout, HS_DMout, and HSOutDis in FIG. 6) supplied to the gate terminal is the same as the active direction of the transmission signal (DP and DM in FIG. 6) output through the source terminal and the drain terminal of the n-type MOS transistor when the gate signal becomes active.

In the case of using the p-type MOS transistor as the switching device as shown in FIG. 8B, the active direction of the gate signal supplied to the gate terminal is opposite to the active direction of the transmission signal output through the source terminal and the drain terminal of the p-type MOS transistor. In this case, since the current flows between the source terminal and the drain terminal of the p-type MOS transistor after the gate signal becomes a logic level of "L", noise in the negative direction may be added to the transmission signal.

Therefore, use of the n-type MOS transistor as the switching device enables the device area to be decreased and noise added to the transmission signal to be removed in comparison with the case of using the p-type MOS transistor, as shown in FIG. 8A. As a result, a highly reliable transmission signal can be generated.

Figure 9:
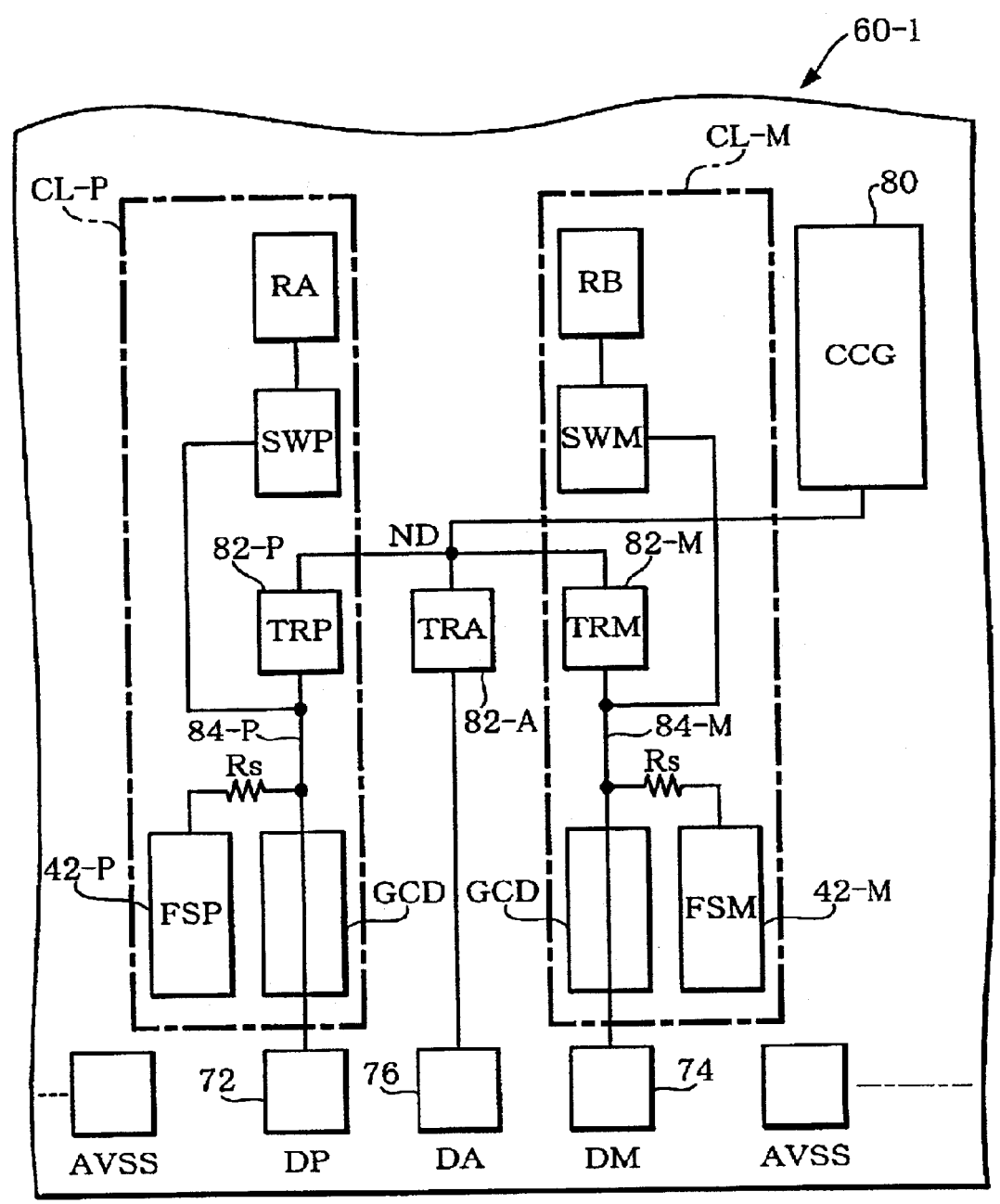
FIG. 9 is an explanatory diagram schematically showing an example of a layout arrangement of a data transfer control device (semiconductor integrated device) of the first embodiment.

FIG. 9 schematically shows an example of the layout arrangement of the data transfer control device (semiconductor integrated device) including the transmission circuit 50 of the first embodiment.

In FIG. 9, sections the same as those of the transmission circuit 50 shown in FIG. 6 are indicated by the same symbols. Description of these sections is appropriately omitted.

The data transfer control device 60-1 including the transmission circuit 50 of the first embodiment is integrated on a semiconductor substrate. In the data transfer control device 60-1, the pads are disposed along the periphery of the substrate. The DP pad 72 and the DM pad 74 are disposed between second power supply AVSS pads, and the DA pad 76 is disposed therebetween.

The DP pad 72 is electrically connected to a first cell CL-P through a given interconnect layer.

The DM pad 74 is electrically connected to a second cell CL-M through a given interconnect layer.

In the first and second cells CL-P and CL-M, the transistors, resistance elements, and switching devices which form the current paths to the differential pair of first and second signal lines 62-1 and 62-2 and interconnects which electrically connect these elements are celled. At least the interconnect layers are disposed mirror-symmetrically between the first and second cells CL-P and CL-M.

In the first cell CL-P, the current path from the node ND to the DP pad 72 which is connected to the first signal line 62-1 is celled.

More specifically, the first cell CL-P includes an arrangement region TRP of the n-type MOS transistor 82-P, an arrangement region FSP of a driver circuit 42-P which drives the DP of the FS driver 42, an arrangement region GCD of an input protection circuit, an arrangement region RA of the pull-up resistor connected to the first power supply 3.3 V, and an arrangement region SWP of a switching device SWA for connecting the pull-up resistor with the first signal line 62-1. The arrangement region FSP and the interconnect layer of the first transmission signal line 84-P are electrically connected through a resistance element arrangement region in which the resistance element having an impedance of Rs is formed. The interconnect layer of the first transmission signal line 84-P electrically connects the arrangement region TRP with the DP pad 72 through the arrangement region GCD of the input protection circuit.

The second cell CL-M includes an arrangement region TRM of the n-type MOS transistor 82-M, an arrangement region FSM of a driver circuit 42-M which drives the DM of the FS driver 42, an arrangement region GCD of the input protection circuit, an arrangement region RB of the pull-up resistor connected to the first power supply 3.3 V, and an arrangement region SWM of a switching device SWB for connecting the pull-up resistor with the second signal line 62-2. The arrangement region FSM and an interconnect layer of the second transmission signal line 84-M are electrically connected through the resistance element arrangement region in which the resistance element having an impedance of Rs is formed. An interconnect layer of the second transmission signal line 84-M electrically connects the arrangement region TRM with the DM pad 74 through the arrangement region GCD of the input protection circuit.

The DA pad 76 is disposed between the DP pad 72 and the DM pad 74. The DA pad 76 and the arrangement region TRA of the n-type MOS transistor 82-A are electrically connected through a given interconnect layer disposed in the direction almost perpendicular to the arrangement direction of the pads.

An arrangement region CCG of the constant current source 80 which supplies current with a constant current value to the node ND is disposed in the region adjacent to the second cell CL-M in order to maintain symmetry between the first and second cells CL-M and CL-P.

This layout arrangement ensures that the parasitic resistance component, capacitance component, and the like on the paths to the first and second signal lines which form the differential pair have substantially equal load regardless of process variation, whereby the noise added to the transmission and reception signals DP and DM which operate as the differential pair is offset with high precision.

Moreover, efficiency of the layout arrangement can be improved by disposing the current path formed in a period other than the signal-transmission period through the n-type MOS transistor 82-A between the paths to the first and second signal lines which form the differential pair.

Second Embodiment

Figure 10:
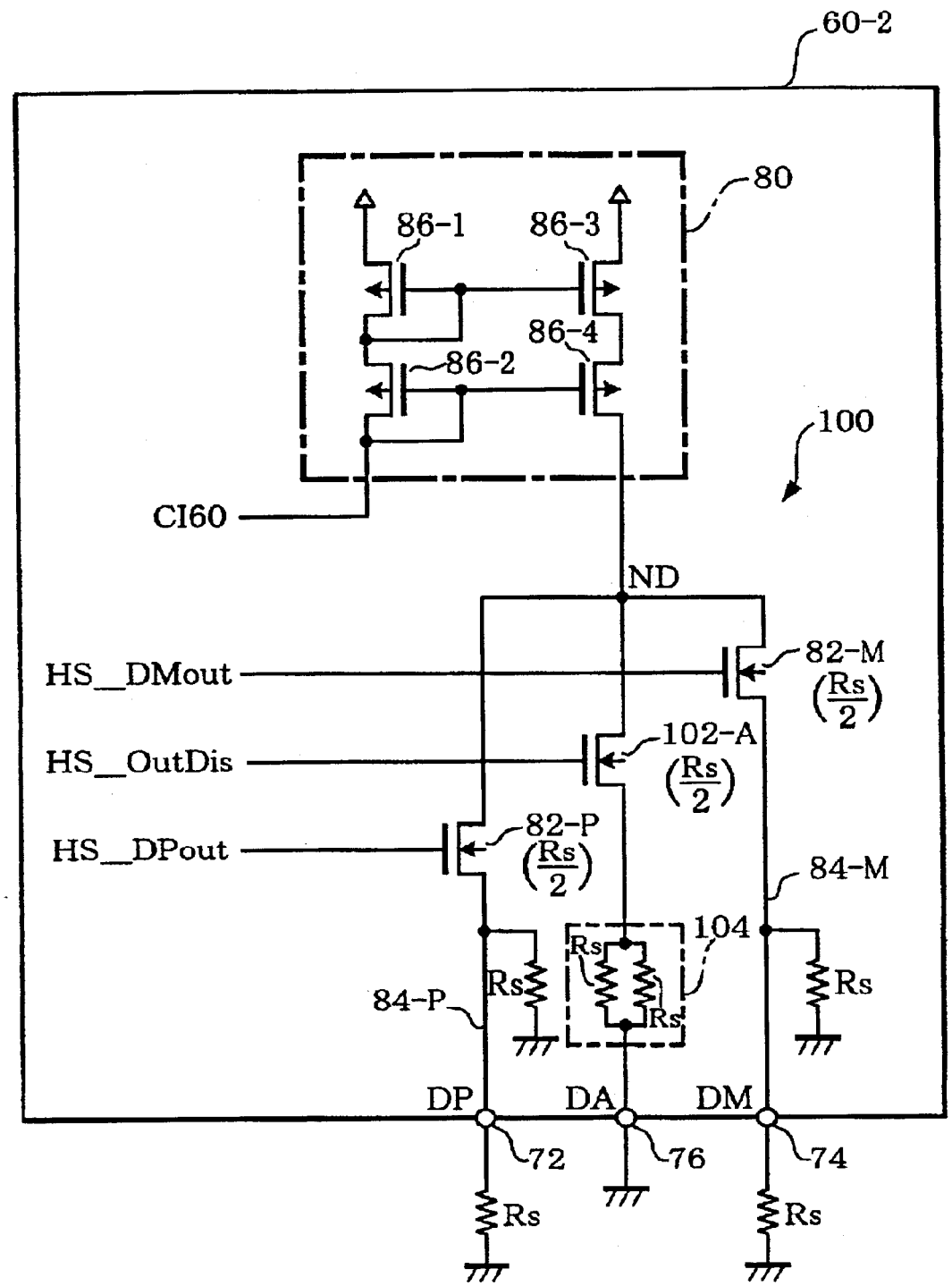
FIG. 10 is a configuration diagram showing an example of a configuration of a transmission circuit of a second embodiment.

FIG. 10 shows a configuration example of a transmission circuit of the second embodiment.

In FIG. 10, sections the same as those of the transmission circuit of the first embodiment shown in FIG. 6 are indicated by the same symbols. Description of these sections is omitted.

A transmission circuit 100 of the second embodiment transmits a signal conforming to the USB 2.0 in a data transfer control device 60-2.

The first difference between the transmission circuit 100 of the second embodiment and the transmission circuit 50 of the first embodiment is that the shape of an n-type MOS transistor 102-A used as the switching device SW3 differs from that of the n-type MOS transistor 82-A.

The second difference between the transmission circuit 100 of the second embodiment and the transmission circuit 50 of the first embodiment is that a resistance element 104 having an impedance of Rs/2 is inserted between the drain terminal of the n-type MOS transistor 102-A and the DA terminal 76.

Specifically, in the transmission circuit 100, the n-type MOS transistor 102-A is formed in the same shape as the n-type MOS transistors 82-P and 82-M so that Wp:Wm:Wa is 1:1:1, whereby the impedance of the on-resistance when the n-type MOS transistor 102-A is turned on by HS_OutDis becomes Rs/2. Moreover, the resistance element 104 having an impedance of Rs/2 is inserted between the drain terminal of the n-type MOS transistor 102-A and the DA terminal 76.

This enables the impedance of the current path from the node ND to the DA terminal 76 to be Rs, whereby the impedances of the current paths from the node ND through the n-type MOS transistors 82-P, 82-M, and 102-A are substantially equal to Rs.

The operation of the transmission circuit 100 of the second embodiment having the above configuration is the same as that of the transmission circuit 50 in the first embodiment.

Therefore, further description is omitted.

Therefore, the transmission circuit 100 of the second embodiment has effects the same as those of the transmission circuit 50 of the first embodiment. Moreover, since the transistors connected to the node ND as the switching devices have the same shape, variation of the on-resistance of each transistor connected to the node ND due to process variation can be absorbed. In the case of forming the resistance element 104 by connecting resistance elements having the same configuration as that of the termination resistors connected to the first and second transmission signal lines 84-M and 84-P in parallel, variation of the resistance value of each resistance element due to process variation can be absorbed.

Figure 11:
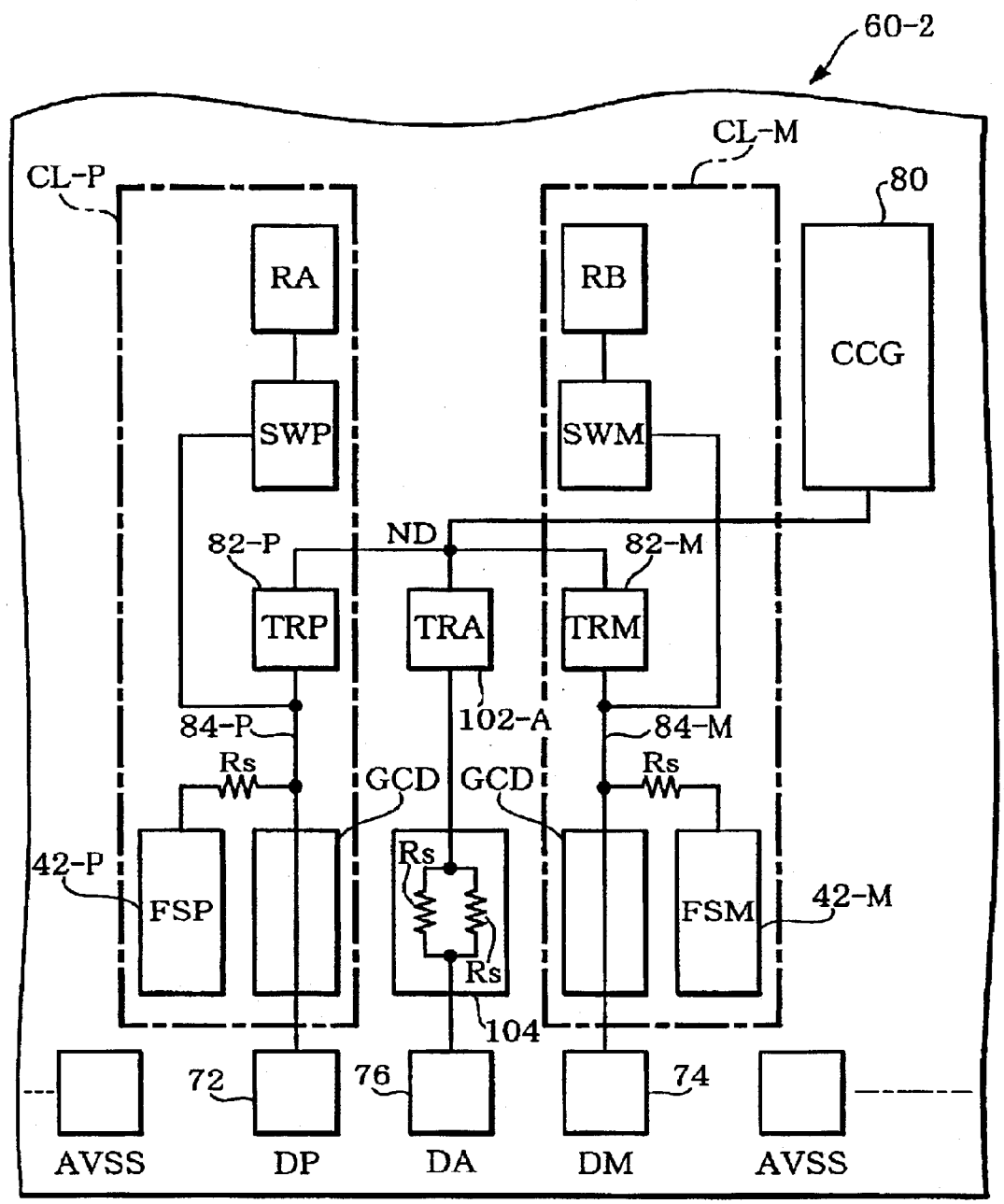
FIG. 11 is an explanatory diagram schematically showing an example of a layout arrangement of a data transfer control device (semiconductor integrated device) of the second embodiment.

FIG. 11 schematically shows an example of the layout arrangement of the data transfer control device including the transmission circuit 100 of the second embodiment.

In FIG. 11, sections the same as those of the transmission circuit 50 shown in FIG. 6 are indicated by the same symbols.

Description of these sections is appropriately omitted. In addition, sections the same as those of the data transfer control device 60-1 shown in FIG. 9 are indicated by the same symbols. Description of these sections is appropriately omitted.

In the data transfer control device 60-2 of the second embodiment, the size of the arrangement region TRA of the n-type MOS transistor 102-A is about half of that of the first embodiment. The resistance element arrangement region including a resistance component having an impedance of Rs/2 is formed between the arrangement region TRA and the DA pad 76.

The DA pad 76 and the arrangement region TRA of the n-type MOS transistor 102-A are electrically connected through the resistance element arrangement region by a given interconnect layer disposed in the direction almost perpendicular to the arrangement direction of the pads.

This layout arrangement enables symmetry to be maintained between the paths to the first and second signal lines which form the differential pair. Moreover, efficiency of the layout arrangement can be improved.

Third embodiment

Figure 12:
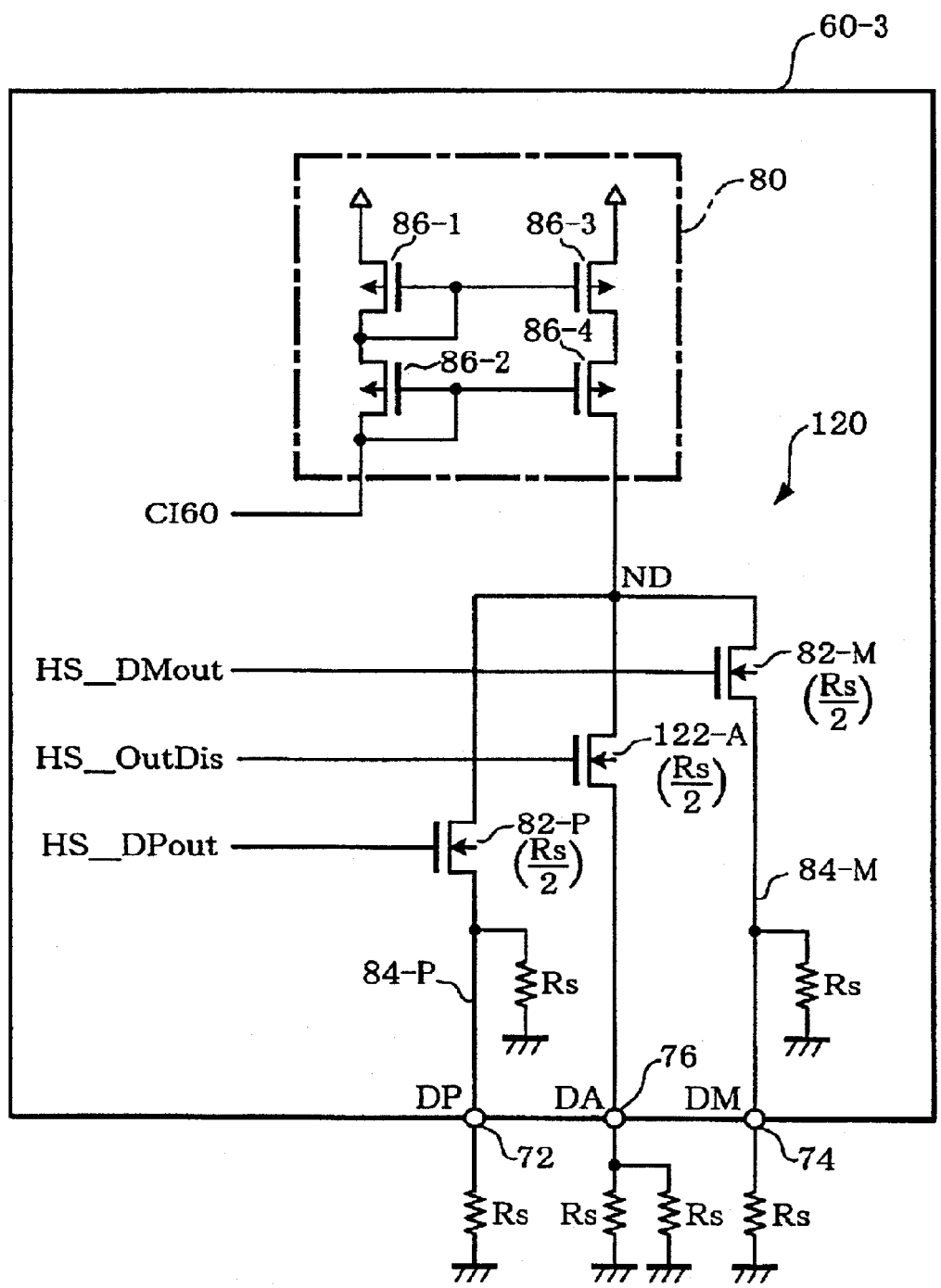
FIG. 12 is a configuration diagram showing an example of configuration of a transmission circuit of a third embodiment.

FIG. 12 shows a configuration example of a transmission circuit of the third embodiment.

In FIG. 12, sections the same as those of the transmission circuit of the first embodiment shown in FIG. 6 are indicated by the same symbols. Description of these sections is omitted.

A transmission circuit 120 of the third embodiment transmits a signal conforming to the USB 2.0 in a data transfer control device 60-3.

The first difference between the transmission circuit 120 of the third embodiment and the transmission circuit 50 of the first embodiment is that the shape of an n-type MOS transistor 122-A used as the switching device SW3 differs from that of the n-type MOS transistor 82-A.

The second difference between the transmission circuit 120 of the third embodiment and the transmission circuit 50 of the first embodiment is that a resistance element having an impedance of Rs/2 is connected to the DA terminal 76 outside the data transfer control device.

Specifically, in the transmission circuit 120, the n-type MOS transistor 122-A is formed in the same shape as the n-type MOS transistors 82-P and 82-M so that Wp:Wm:Wa is 1:1:1, whereby the impedance of the on-resistance when the n-type MOS transistor 122-A is turned on by HS_OutDis becomes Rs/2. Moreover, the resistance element having an impedance of Rs/2 is connected to the DA terminal 76 outside the data transfer control device.

This enables the impedance of the current path from the node ND to the DA terminal 76 to be Rs/2, whereby the impedances of the current paths from the node ND through the n-type MOS transistors 82-P, 82-M, and 122-A are substantially equal to Rs.

The operation of the transmission circuit 120 of the third embodiment having the above configuration is the same as that of the transmission circuit 50 in the first embodiment. Therefore, further description is omitted.

Therefore, the transmission circuit 120 of the third embodiment has effects the same as those of the transmission circuit 50 of the first embodiment. Moreover, since the transistors connected to the node ND as the switching devices have the same shape, variation of the on-resistance of each transistor connected to the node ND due to process variation can be absorbed. Moreover, it is unnecessary to provide the resistance element 104 in the data transfer control device differing from the second embodiment, whereby the size and cost of the transmission circuit can be reduced.

Figure 13:
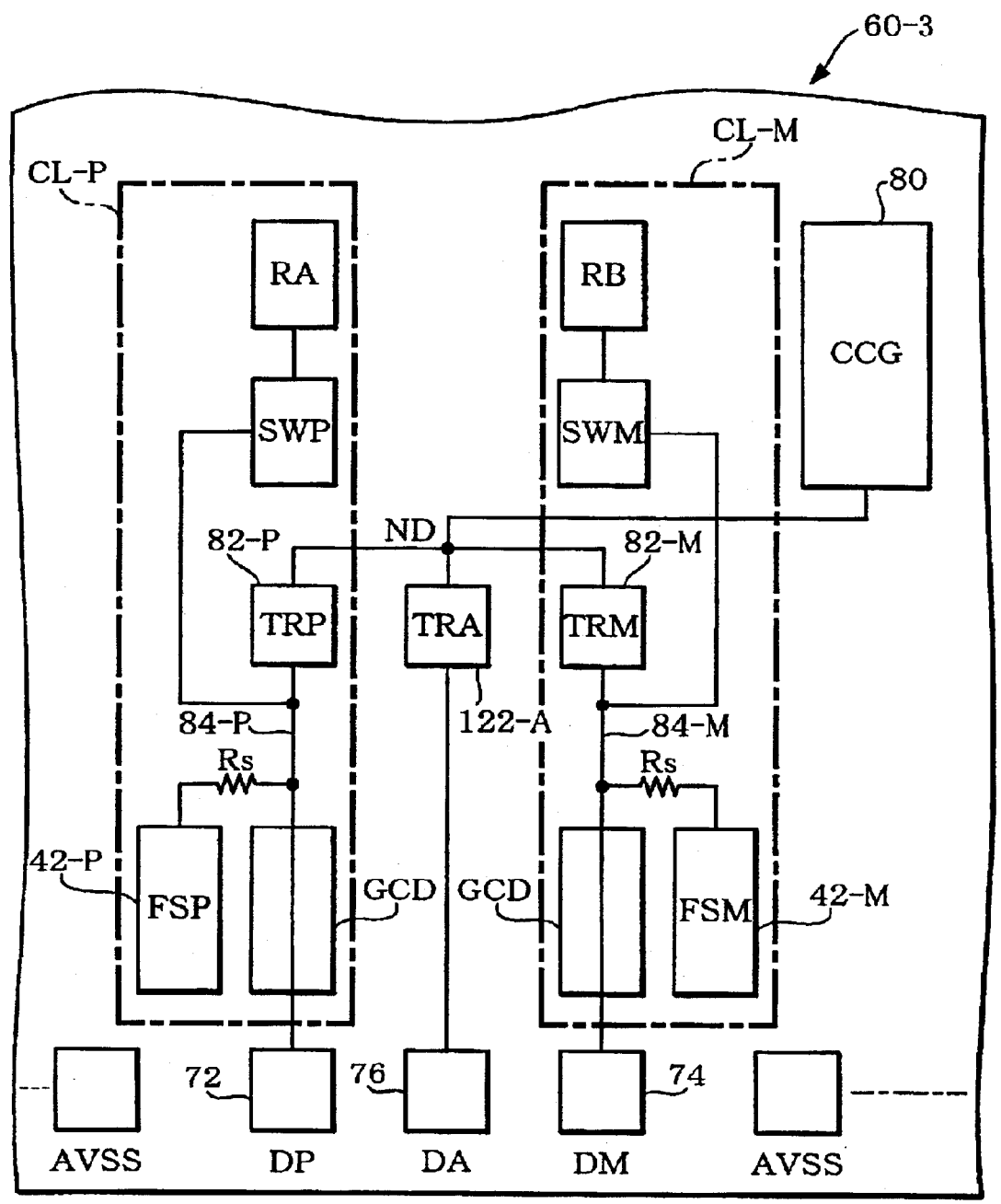
FIG. 13 is an explanatory diagram schematically showing an example of a layout arrangement of a data transfer control device (semiconductor integrated device) of the third embodiment.

FIG. 13 schematically shows an example of the layout arrangement of the data transfer control device including the transmission circuit 120 of the third embodiment.

In FIG. 13, sections the same as those of the transmission circuit 50 shown in FIG. 6 are indicated by the same symbols. Description of these sections is appropriately omitted. In addition, sections the same as those of the data transfer control device 60-1 shown in FIG. 9 are indicated by the same symbols. Description of these sections is appropriately omitted.

In the data transfer control device 60-3 of the third embodiment, the size of the arrangement region TRA of the n-type MOS transistor 122-A is about half in comparison with the first embodiment. This increases the degree of freedom relating to the arrangement of other elements.

In this case, symmetry can be maintained between the paths to the first and second signal lines which form the differential pair in the same manner as in the first embodiment. Moreover, efficiency of the layout arrangement can be improved.

Fourth Embodiment

Figure 14:
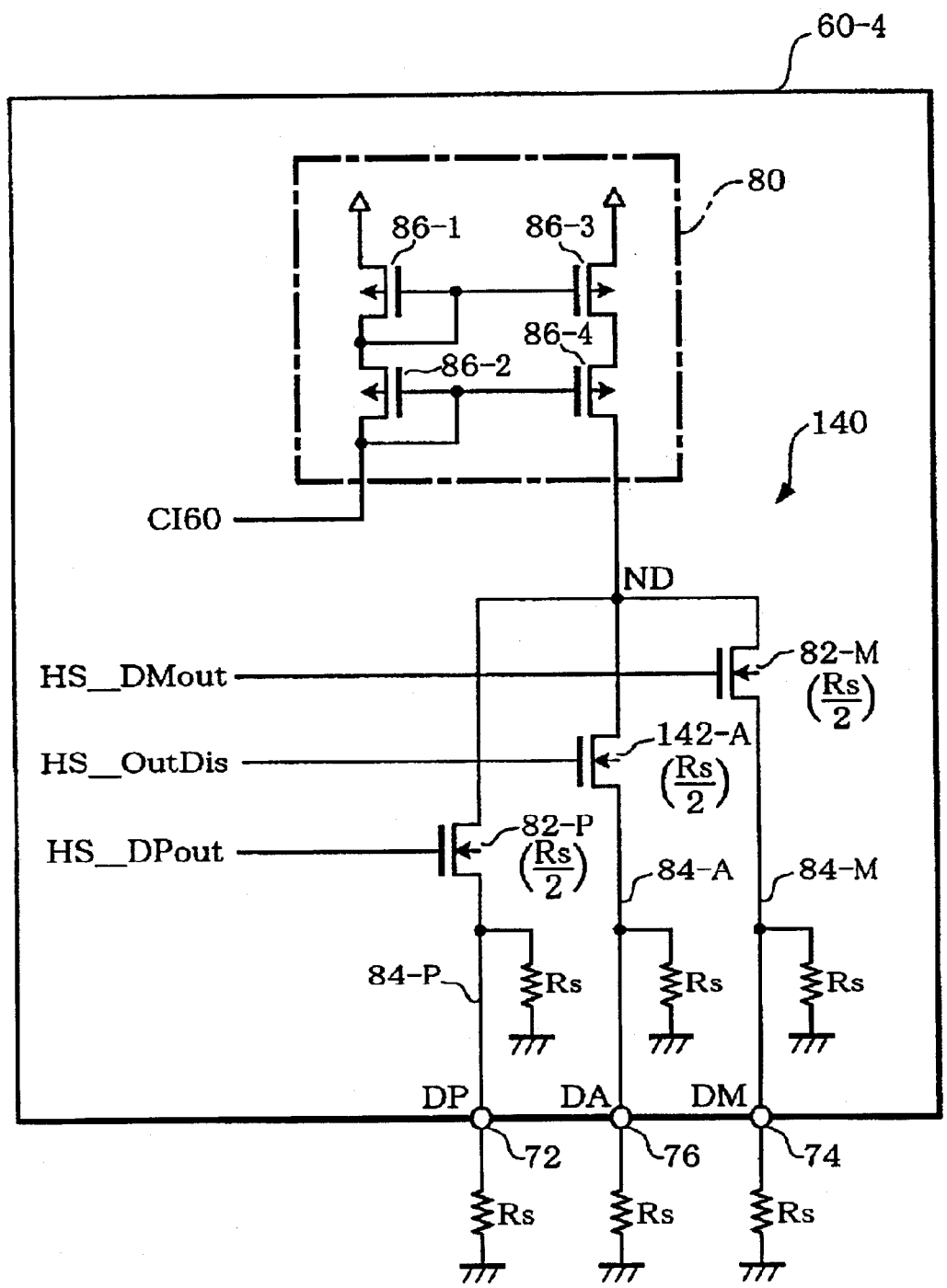
FIG. 14 is a configuration diagram showing an example of a configuration of a transmission circuit of a fourth embodiment.

FIG. 14 shows a configuration example of a transmission circuit of the fourth embodiment.

In FIG. 14, sections the same as those of the transmission circuit of the first embodiment shown in FIG. 6 are indicated by the same symbols. Description of these sections is omitted.

A transmission circuit 140 of the fourth embodiment transmits a signal conforming to the USB 2.0 in a data transfer control device 60-4.

The first difference between the transmission circuit 140 of the fourth embodiment and the transmission circuit 50 of the first embodiment is that the shape of an n-type MOS transistor 142-A used as the switching device SW3 differs from that of the n-type MOS transistor 82-A.

The second difference between the transmission circuit 140 of the fourth embodiment and the transmission circuit 50 of the first embodiment is that a resistance element having an impedance of Rs is connected between a third transmission signal line 84-A which electrically connects the drain terminal of the n-type MOS transistor 142-A with the DA terminal 76 and the second power supply AVSS.

The third difference between the transmission circuit 140 of the fourth embodiment and the transmission circuit 50 of the first embodiment is that a resistance element having an impedance of Rs is connected to the DA terminal 76 outside the data transfer control device.

Specifically, in the transmission circuit 140, the n-type MOS transistor 142-A is formed in the same shape as the n-type MOS transistors 82-P and 82-M so that Wp:Wm:Wa is 1:1:1, whereby the impedance of the on-resistance when the n-type MOS transistor 142-A is turned on by HS_OutDis becomes Rs/2. The resistance element having an impedance of Rs is connected between the third transmission signal line 84-A and the second power supply AVSS, and the DA terminal 76 is terminated by the resistance element having an impedance of Rs.

This enables the impedance of the current path from the node ND to the DA terminal 76 to be Rs/2, whereby the impedances of the current paths from the node ND through the n-type MOS transistors 82-P, 82-M, and 142-A are substantially equal to Rs.

The operation of the transmission circuit 140 of the fourth embodiment having the above configuration is the same as that of the transmission circuit 50 of the first embodiment. Therefore, further description is omitted.

Therefore, the transmission circuit 140 of the fourth embodiment has effects the same as those of the transmission circuit 50 in the first embodiment. Moreover, since the transistors connected to the node ND as the switching devices have the same shape, variation of the on-resistance of each transistor connected to the node ND due to process variation can be absorbed. Moreover, since the DA terminal has the same configuration as the DP terminal and the DM terminal, the number of design steps such as cell appropriation and layout arrangement can be reduced and the characteristics can be easily made uniform.

Figure 15:
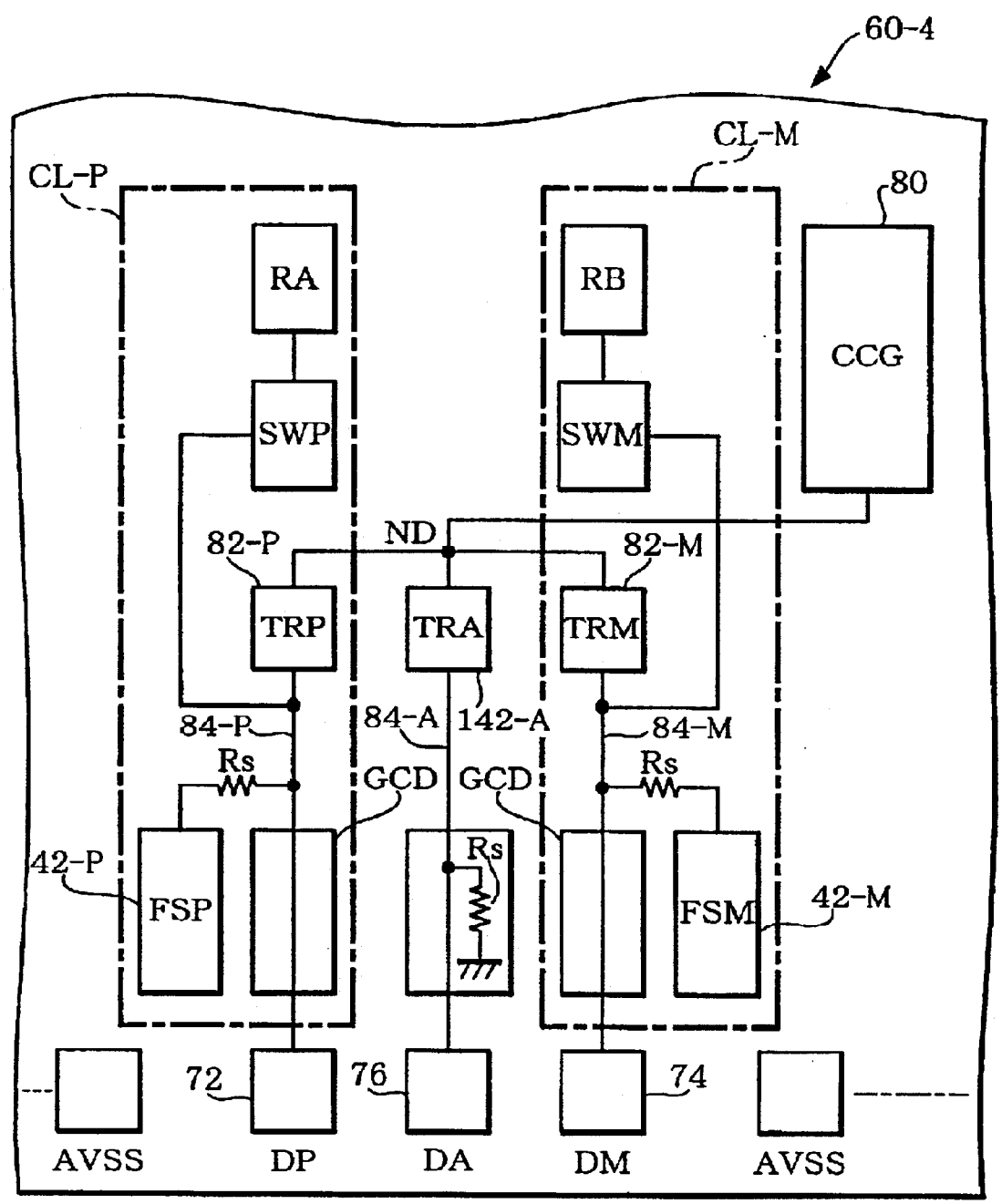
FIG. 15 is an explanatory diagram schematically showing an example of a layout arrangement of a data transfer control device (semiconductor integrated device) of the fourth embodiment.

FIG. 15 schematically shows an example of the layout arrangement of the data transfer control device including the transmission circuit 140 of the fourth embodiment.

In FIG. 15, sections the same as those of the transmission circuit 50 shown in FIG. 6 are indicated by the same symbols. Description of these sections is appropriately omitted. In addition, sections the same as those of the data transfer control device 60-1 shown in FIG. 9 are indicated by the same symbols. Description of these sections is appropriately omitted.

In the data transfer control device 60-4 of the fourth embodiment, the size of the arrangement region TRA of the n-type MOS transistor 142-A is about half in comparison with the first embodiment. The resistance element arrangement region including a resistance component having an impedance of Rs is formed between the arrangement region TRA and the DA pad 76. The interconnect layer of the third transmission signal line 84-A is electrically connected to this resistance component between the third transmission signal line 84-A and the second power supply AVSS. The DA pad 76 and the arrangement region TRA of the n-type MOS transistor 142-A are electrically connected through the resistance element arrangement region by the interconnect layer of the third transmission signal line 84-A disposed in the direction almost perpendicular to the arrangement direction of the pads.

This layout arrangement enables symmetry to be maintained between the paths to the first and second signal lines which form the differential pair. Moreover, efficiency of the layout arrangement can be improved.

Fifth Embodiment

Figure 16:
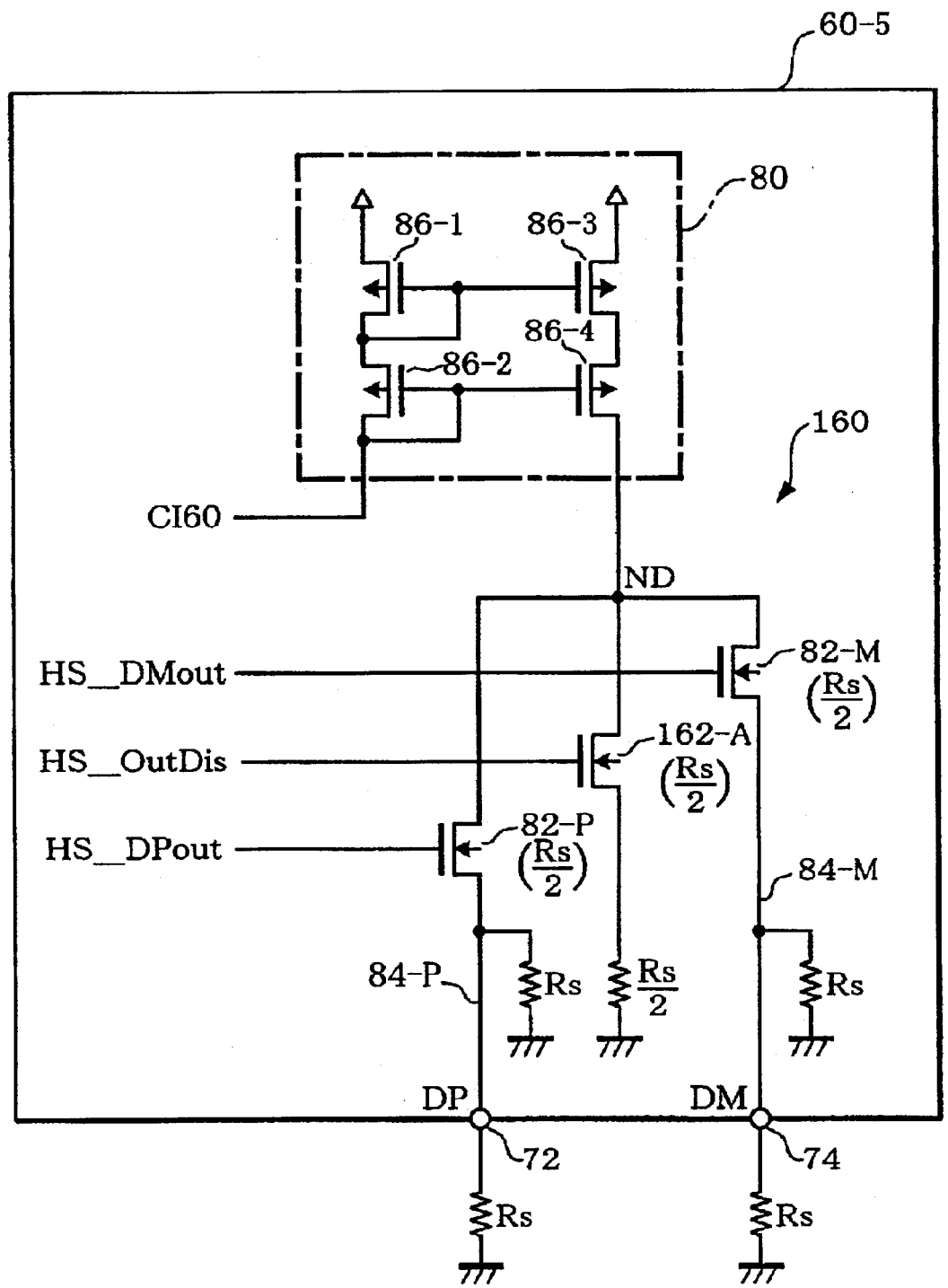
FIG. 16 is a configuration diagram showing an example of a configuration of a transmission circuit of a fifth embodiment.

FIG. 16 shows a configuration example of a transmission circuit of the fifth embodiment.

In FIG. 16, sections the same as those of the transmission circuit of the first embodiment shown in FIG. 6 are indicated by the same symbols. Description of these sections is omitted.

A transmission circuit 160 of the fifth embodiment transmits a signal conforming to the USB 2.0 in a data transfer control device 60-5.

The first difference between the transmission circuit 160 of the fifth embodiment and the transmission circuit 50 of the first embodiment is that the shape of an n-type MOS transistor 162-A used as the switching device SW3 differs from that of the n-type MOS transistor 82-A.

The second difference between the transmission circuit 160 of the fifth embodiment and the transmission circuit 50 of the first embodiment is that a resistance element having an impedance of Rs/2 is inserted between the n-type MOS transistor 162-A and the second power supply AVSS.

The third difference between the transmission circuit 160 of the fifth embodiment and the transmission circuit 50 of the first embodiment is that the DA terminal is omitted.

Specifically, in the transmission circuit 160, the n-type MOS transistor 162-A is formed in the same shape as the n-type MOS transistors 82-P and 82-M so that Wp:Wm:Wa is 1:1:1, whereby the impedance of the on-resistance when the n-type MOS transistor 162-A is turned on by HS OutDis becomes Rs/2. Moreover, the resistance element having an impedance of Rs/2 is connected between the drain terminal of the n-type MOS transistor 162-A and the second power supply AVSS, and the DA terminal is omitted.

This enables the impedance of the current path from the node ND to the n-type MOS transistor 162-A to be Rs, whereby the impedances of the current paths from the node ND through the n-type MOS transistors 82-P, 82-M, and 162-A are substantially equal to Rs.

The operation of the transmission circuit 160 of the fifth embodiment having the above configuration is the same as that of the transmission circuit 50 of the first embodiment. Therefore, further description is omitted.

Therefore, the transmission circuit 160 of the fifth embodiment has effects the same as those of the transmission circuit 50 of the first embodiment. Moreover, since the transistors connected to the node ND as the switching devices have the same shape, variation of the on-resistance of each transistor connected to the node ND due to process variation can be absorbed. Moreover, since the drain terminal of the n-type MOS transistor 162-A used as the switching device SW3 is connected to the second power supply AVSS in the data transfer control device, the number of terminals can be decreased, thereby reducing cost of the data transfer control device.

Figure 17:
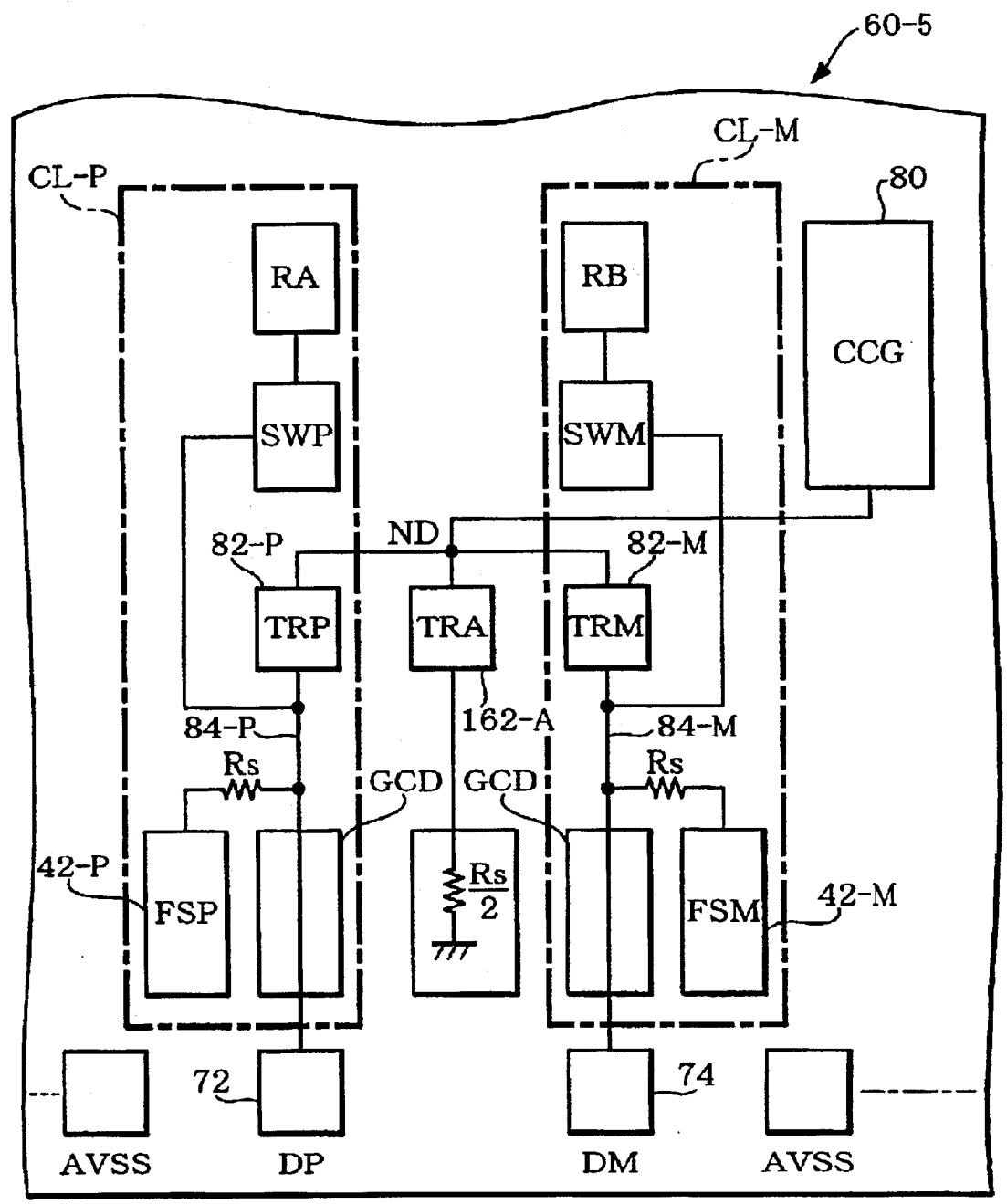
FIG. 17 is an explanatory diagram schematically showing an example of a layout arrangement of a data transfer control device (semiconductor integrated device) of the fifth embodiment.

FIG. 17 schematically shows an example of the layout arrangement of the data transfer control device including the transmission circuit 160 of the fifth embodiment.

In FIG. 17, sections the same as those of the transmission circuit 50 shown in FIG. 6 are indicated by the same symbols. Description of these sections is appropriately omitted. In addition, sections the same as those of the data transfer control device 60-1 shown in FIG. 9 are indicated by the same symbols. Description of these sections is appropriately omitted.

In the data transfer control device 60-5 of the fifth embodiment, the size of the arrangement region TRA of the n-type MOS transistor 162-A is about half of that of the first embodiment. The resistance element arrangement region including a resistance component having an impedance of Rs/2, one end of which is electrically connected to the second power supply AVSS, is formed, and the DA pad 76 is omitted.

The arrangement region TRA of the n-type MOS transistor 162-A is electrically connected to the resistance element arrangement region through a given interconnect layer disposed in the direction almost perpendicular to the arrangement direction of the pads.

This layout arrangement enables symmetry to be maintained between the current paths to the first and second signal lines which form the differential pair. Moreover, efficiency of the layout arrangement can be improved.

4. Electronic Equipment

An example of electronic equipment to which the data transfer control devices (semiconductor integrated devices in a broad sense) including the transmission circuit of the first to fifth embodiments is described below.

Figure 18A:
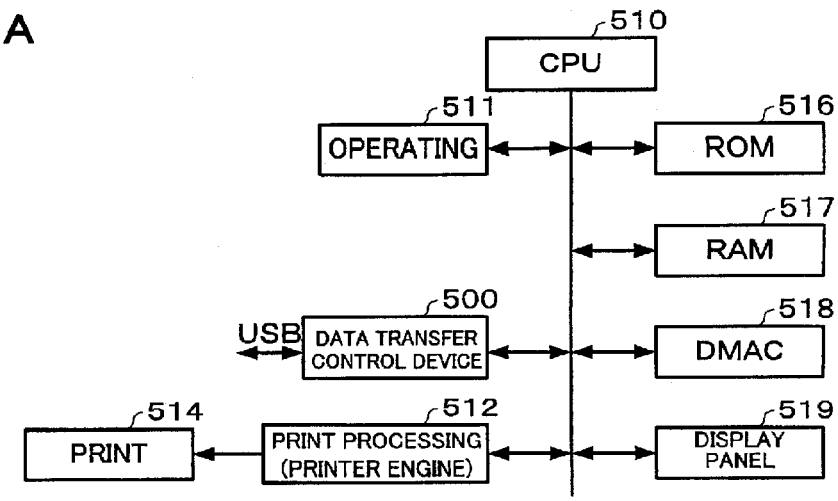
FIGS. 18A, 18B, and 18C show examples of internal block diagrams of various types of electronic equipment.
Figure 19A:
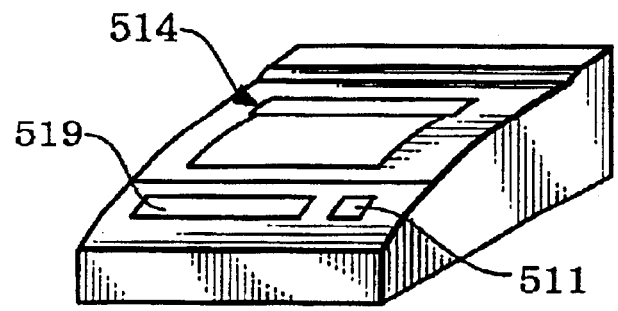
FIGS. 19A, 19B, and 19C show examples of the appearances of various types of electronic equipment.

FIG. 18A is an internal block diagram of a printer which is an example of the electronic equipment. FIG. 19A is a view showing the appearance of the printer. A CPU (microcomputer) 510 controls the entire system and the like. An operating section 511 allows the user to operate the printer. Control programs, fonts, and the like are stored in a ROM 516. A RAM 517 functions as a work area of the CPU 510. A DMAC 518 is a DMA controller for transferring data without using the CPU 510. A display panel 519 informs the user of the operation state of the printer.

Serial print data sent from other devices such as a personal computer through the USB is converted into parallel print data by a data transfer control device 500. The converted parallel print data is sent to a print processing section (printer engine) 512 by the CPU 510 or DMAC 518. The parallel print data is subjected to given processing in the print processing section 512, and printed on paper by a print section (device which performs output processing on data) 514 consisting of a print head and the like.

Figure 18B:
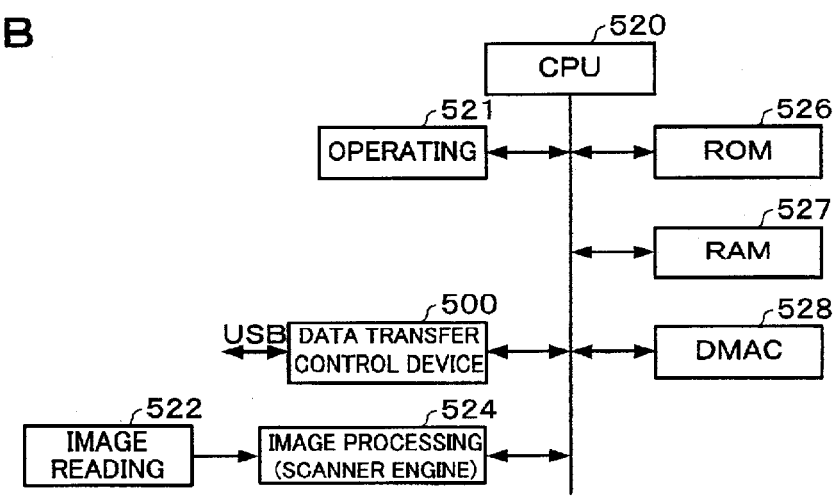
Figure 19B:
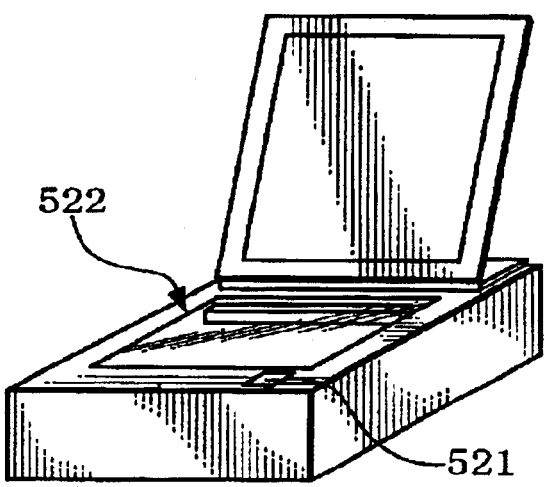

FIG. 18B is an internal block diagram of a scanner which is an example of the electronic equipment. FIG. 19B is a view showing the appearance of the scanner. A CPU 520 controls the entire system and the like. An operating section 521 allows the user to operate the scanner. Control programs and the like are stored in a ROM 526. A RAM 527 functions as a work area of the CPU 520. A DMAC 528 is a DMA controller.

An image of a manuscript is scanned by an image reading section (device which fetches data) 522 consisting of a light source, optical/electrical converter, and the like. The read image data is processed by an image processing section (scanner engine) 524. The processed image data is sent to the data transfer control device 500 by the CPU 520 or DMAC 528. The data transfer control device 500 converts this parallel image data into serial data, and transmits the data to other devices such as a personal computer through the USB.

Figure 18C:
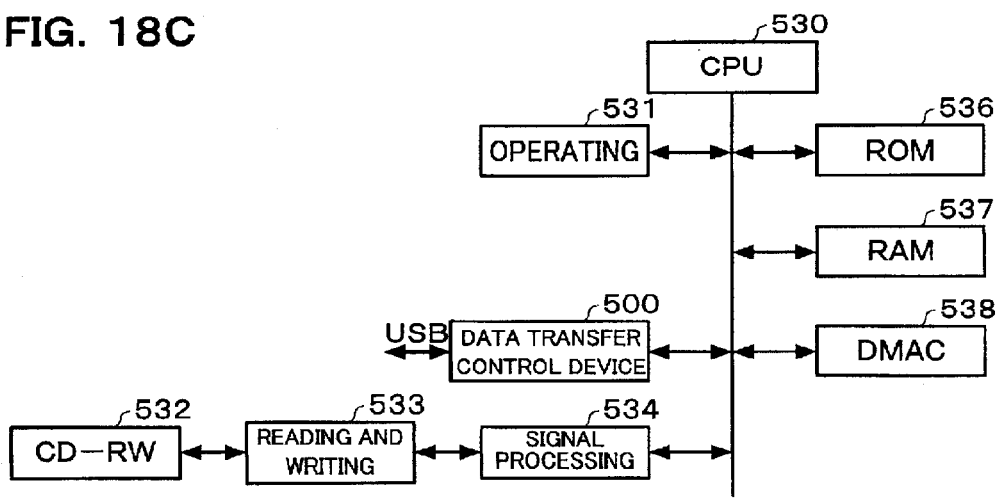
Figure 19C:
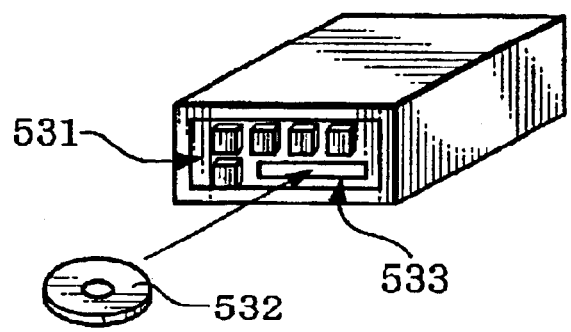

FIG. 18C is an internal block diagram of a CD-RW drive which is an example of the electronic equipment. FIG. 19C is a view showing the appearance of the CD-RW drive. A CPU 530 controls the entire system and the like. An operating section 531 allows the user to operate the CD-RW. Control programs and the like are stored in a ROM 536. A RAM 537 functions as a work area of the CPU 530. A DMAC 538 is a DMA controller.

Data read from a CD-RW 532 by a reading & writing section (device for reading data or device for storing data) 533 consisting of a laser, motor, optical system, and the like is input to a signal processing section 534, and subjected to given signal processing such as error correction processing. The signal-processed data is sent to the data transfer control device 500 by the CPU 530 or DMAC 538. The data transfer control device 500 converts this parallel data into serial data and transmits the data to other devices such as a personal computer through the USB.

Serial data sent from other devices through the USB is converted into parallel data by the data transfer control device 500. This parallel data is sent to the signal processing section 534 by the CPU 530 or DMAC 538. The parallel data is subjected to given processing in the signal processing section 534 and stored on the CD-RW 532 by the reading & writing section 533.

In FIGS. 18A, 18B, and 18C, a CPU for controlling data transfer in the data transfer control device 500 may be provided in addition to the CPUs 510, 520 and 530.

Data transfer in the USB 2.0 HS mode can be realized by using the data transfer control device including any of the transmission circuits of the first to fifth embodiments in the electronic equipment. Therefore, printing can be completed with less of a time lag after receiving the user's instruction through a personal computer or the like. Moreover, the user can see an image read by a scanner with less of a time lag after sending instructions to the scanner to read the image. Furthermore, data can be read from or written into the CD-RW at high speed.

A data transfer control device capable of transferring data in the HS mode can be manufactured using a conventional semiconductor process at a low manufacturing cost by using the data transfer control device including any of the transmission circuits of the first to fifth embodiments in the electronic equipment. Therefore, costs of the data transfer control device and the electronic equipment can be reduced. Moreover, reliability of data transfer can be improved, whereby reliability of the electronic equipment can also be improved.

In addition, it becomes possible to deal with demand from various types of manufacturers of electronic equipment by using the data transfer control device including any of the transmission circuits of the first to fifth embodiments in the electronic equipment while maintaining the performance of the data transfer control device. This increases the added value of the electronic equipment.

As the electronic equipment to which the data transfer control device including any of the transmission circuits of the first to fifth embodiments can be applied, in addition to the above examples, various types of optical disk drives (CD-ROM and DVD), magneto-optical disk drives (MO), hard disk drives, TVs, VTRs, video cameras, audio equipment, telephones, projectors, personal computers, electronic notebooks, word processors, and the like can be given.

The present invention is not limited to the above-described embodiments. Various modifications and variations are possible within the spirit and scope of the present invention.

The present invention is particularly preferably applied to the USB 2.0 interface (data transfer). However, the application of the present invention is not limited thereto. For example, the present invention may be applied to interfaces of standards based on the same idea as the USB 2.0 and standards developed from the USB 2.0.

What is claimed is:

1. A semiconductor integrated device which drives current through first and second signal lines forming a differential pair, the semiconductor integrated device comprising:

first and second pads through which current is driven exclusively in a signal-output period, the first and second pads being connected to the first and second signal lines, respectively; and a third pad through which current is driven in a period other than the signal-output period, wherein the third pad is disposed between the first and second pads.

2. The semiconductor integrated device as defined in claim 1, comprising:
- a current source connected between a first power supply and a given node;
- first and second transistors which electrically connect the node with one of the first and second pads in the signal-output period; and
- a third transistor which electrically connects the node with the third pad in a period other than the signal-output period.

3. The semiconductor integrated device as defined in claim 2, comprising:
- when the first and second signal lines are terminated at a given impedance of Z0,
- a first load element which is connected between a first transmission signal line connecting the first transistor with the first pad and a second power supply, and has an impedance substantially equal to the impedance Z0; and
- a second load element which is connected between a second transmission signal line connecting the second transistor with the second pad and a second power supply, and has an impedance substantially equal to the impedance Z0,
- wherein the first transistor is inserted between the node and the first pad and has an impedance substantially equal to the impedance Z0/2 when the first transistor is turned on,
- wherein the second transistor is inserted between the node and the second pad and has an impedance substantially equal to the impedance Z0/2 when the second transistor is turned on, and
- wherein the third transistor is inserted between the node and the third pad and has an impedance substantially equal to the impedance Z0 when the third transistor is turned on.

4. The semiconductor integrated device as defined in claim 3, comprising:
- a third load element which is connected between the third transistor and the third pad and has an impedance substantially equal to the impedance Z0/2,
- wherein the third transistor has an impedance substantially equal to the impedance Z0/2 when the third transistor is turned on.

5. The semiconductor integrated device as defined in claim 3,
- wherein the third transistor has an impedance substantially equal to the impedance Z0/2 when the third transistor is turned on, and
- wherein the third pad is terminated at an impedance substantially equal to the impedance Z0/2 outside the semiconductor integrated device.

6. The semiconductor integrated device as defined in claim 3, comprising:
- a fourth load element which is connected between a third transmission signal line connecting the third transistor with the third pad and a second power supply, and has an impedance substantially equal to the impedance Z0,
- wherein the third transistor has an impedance substantially equal to the impedance Z0/2 when the third transistor is turned on, and
- wherein the third pad is terminated at an impedance substantially equal to the impedance Z0 outside the semiconductor integrated device.

7. The semiconductor integrated device as defined in claim 3, comprising:
- a fifth load element which is inserted between the third transistor and the second power supply and has an impedance substantially equal to the impedance Z0/2,
- wherein the third transistor has an impedance substantially equal to the impedance Z0/2 when the third transistor is turned on, and
- wherein the third pad is omitted.

8. The semiconductor integrated device as defined in claim 2,
- wherein at least one of the first to third transistors is an n-type MOS transistor.

9. The semiconductor integrated device as defined in claim 2,
- wherein a first cell including the first transistor connected to the first pad and a second cell including the second transistor connected to the second pad are disposed so that parasitic loads on an interconnect and a transistor connected to each of the first and second pads are substantially equal between the first and second cells, and
- wherein the current source is disposed adjacent to the first and second cells.

10. The semiconductor integrated device as defined in claim 3,
- wherein a first cell including the first transistor connected to the first pad and a second cell including the second transistor connected to the second pad are disposed so that parasitic loads on an interconnect and a transistor connected to each of the first and second pads are substantially equal between the first and second cells, and
- wherein the current source is disposed adjacent to the first and second cells.

11. The semiconductor integrated device as defined in claim 4,
- wherein a first cell including the first transistor connected to the first pad and a second cell including the second transistor connected to the second pad are disposed so that parasitic loads on an interconnect and a transistor connected to each of the first and second pads are substantially equal between the first and second cells, and
- wherein the current source is disposed adjacent to the first and second cells.

12. The semiconductor integrated device as defined in claim 5,
- wherein a first cell including the first transistor connected to the first pad and a second cell including the second transistor connected to the second pad are disposed so that parasitic loads on an interconnect and a transistor connected to each of the first and second pads are substantially equal between the first and second cells, and
- wherein the current source is disposed adjacent to the first and second cells.

13. The semiconductor integrated device as defined in claim 6,
- wherein a first cell including the first transistor connected to the first pad and a second cell including the second transistor connected to the second pad are disposed so that parasitic loads on an interconnect and a transistor connected to each of the first and second pads are substantially equal between the first and second cells, and wherein the current source is disposed adjacent to the first and second cells.

14. The semiconductor integrated device as defined in claim 7,
wherein a first cell including the first transistor connected to the first pad and a second cell including the second transistor connected to the second pad are disposed so that parasitic loads on an interconnect and a transistor connected to each of the first and second pads are substantially equal between the first and second cells, and
wherein the current source is disposed adjacent to the first and second cells.

15. The semiconductor integrated device as defined in claim 8,
wherein a first cell including the first transistor connected to the first pad and a second cell including the second transistor connected to the second pad are disposed so that parasitic loads on an interconnect and a transistor connected to each of the first and second pads are substantially equal between the first and second cells, and
wherein the current source is disposed adjacent to the first and second cells.

16. The semiconductor integrated device as defined in claim 4,
wherein the third load element is disposed between a first cell including the first transistor connected to the first pad and a second cell including the second transistor connected to the second pad.

17. The semiconductor integrated device as defined in claim 6,
wherein the fourth load element is disposed between a first cell including the first transistor connected to the first pad and a second cell including the second transistor connected to the second pad.

18. The semiconductor integrated device as defined in claim 7,
wherein the fifth load element is disposed between a first cell including the first transistor connected to the first pad and a second cell including the second transistor connected to the second pad.

19. The semiconductor integrated device as defined in claim 1,
wherein positions of the first to third pads are determined so that difference in length among bonding wires connected to the first to third pads is minimum.

20. The semiconductor integrated device as defined in claim 2,
wherein a signal transmitted through the first and second signal lines is a signal conforming to the Universal Serial Bus (USB) standard.

21. A semiconductor integrated device which drives current through first and second signal lines which are terminated at a given impedance Z0 and form a differential pair, the semiconductor integrated device comprising:
first and second pads through which current is driven exclusively in a signal-output period, the first and second pads being connected to the first and second signal lines, respectively;
a third pad through which current is driven in a period other than the signal-output period;
a current source connected between a first power supply and a given node;
first and second transistors which electrically connect the node with one of the first and second pads in the signal-output period;
a third transistor which electrically connects the node with the third pad in a period other than the signal-output period;
a first load element which is connected between a first transmission signal line connecting the first transistor with the first pad and a second power supply, and has an impedance substantially equal to the impedance Z0; and
a second load element which is connected between a second transmission signal line connecting the second transistor with the second pad and a second power supply, and has an impedance substantially equal to the impedance Z0,
wherein at least one of the first to third transistors is an n-type MOS transistor,
wherein a signal transmitted through the first and second signal lines is a signal conforming to the Universal Serial Bus (USB) standard,
wherein the third pad is disposed between the first and second pads,
wherein the first transistor is inserted between the node and the first pad and has an impedance substantially equal to the impedance Z0/2 when the first transistor is turned on,
wherein the second transistor is inserted between the node and the second pad and has an impedance substantially equal to the impedance Z0/2 when the second transistor is turned on,
wherein the third transistor is inserted between the node and the third pad and has an impedance substantially equal to the impedance Z0 when the third transistor is turned on,
wherein a first cell including the first transistor connected to the first pad and a second cell including the second transistor connected to the second pad are disposed so that parasitic loads on an interconnect and a transistor connected to each of the first and second pads are substantially equal between the first and second cells, and
wherein the current source is disposed adjacent to the first and second cells.

22. A semiconductor integrated device which drives current through first and second signal lines which are terminated at a given impedance Z0 and form a differential pair, the semiconductor integrated device comprising:
first and second pads through which current is driven exclusively in a signal-output period, the first and second pads being connected to the first and second signal lines, respectively;
a third pad through which current is driven in a period other than the signal-output period;
a current source connected between a first power supply and a given node;
first and second transistors which electrically connect the node with one of the first and second pads in the signal-output period;
a third transistor which electrically connects the node with the third pad in a period other than the signal-output period;
a first load element which is connected between a first transmission signal line connecting the first transistor with the first pad and a second power supply, and has an impedance substantially equal to the impedance Z0; and a second load element which is connected between a second transmission signal line connecting the second transistor with the second pad and a second power supply, and has an impedance substantially equal to the impedance Z0; and a third load element which is connected between the third transistor and the third pad and has an impedance substantially equal to the impedance Z0/2, wherein at least one of the first to third transistors is an n-type MOS transistor, wherein a signal transmitted through the first and second signal lines is a signal conforming to the Universal Serial Bus (USB) standard, wherein the third pad is disposed between the first and second pads, wherein the first transistor is inserted between the node and the first pad and has an impedance substantially equal to the impedance Z0/2 when the first transistor is turned on, wherein the second transistor is inserted between the node and the second pad and has an impedance substantially equal to the impedance Z0/2 when the second transistor is turned on, wherein the third transistor is inserted between the node and the third pad and has an impedance substantially equal to the impedance Z0/2 when the third transistor is turned on, wherein a first cell including the first transistor connected to the first pad and a second cell including the second transistor connected to the second pad are disposed so that parasitic loads on an interconnect and a transistor connected to each of the first and second pads are substantially equal between the first and second cells, and wherein the current source is disposed adjacent to the first and second cells.

23. A semiconductor integrated device which drives current through first and second signal lines which are terminated at a given impedance Z0 and form a differential pair, the semiconductor integrated device comprising:

first and second pads through which current is driven exclusively in a signal-output period, the first and second pads being connected to the first and second signal lines, respectively;

a third pad through which current is driven in a period other than the signal-output period;

a current source connected between a first power supply and a given node;

first and second transistors which electrically connect the node with one of the first and second pads in the signal-output period;

a third transistor which electrically connects the node with the third pad in a period other than the signal-output period;

a first load element which is connected between a first transmission signal line connecting the first transistor with the first pad and a second power supply, and has an impedance substantially equal to the impedance Z0; and a second load element which is connected between a second transmission signal line connecting the second transistor with the second pad and a second power supply, and has an impedance substantially equal to the impedance Z0, wherein at least one of the first to third transistors is an n-type MOS transistor, wherein a signal transmitted through the first and second signal lines is a signal conforming to the Universal Serial Bus (USB) standard, wherein the third pad is disposed between the first and second pads and terminated at an impedance substantially equal to the impedance Z0/2 outside the semiconductor integrated device, wherein the first transistor is inserted between the node and the first pad and has an impedance substantially equal to the impedance Z0/2 when the first transistor is turned on, wherein the second transistor is inserted between the node and the second pad and has an impedance substantially equal to the impedance Z0/2 when the second transistor is turned on, wherein the third transistor is inserted between the node and the third pad and has an impedance substantially equal to the impedance Z0/2 when the third transistor is turned on, wherein a first cell including the first transistor connected to the first pad and a second cell including the second transistor connected to the second pad are disposed so that parasitic loads on an interconnect and a transistor connected to each of the first and second pads are substantially equal between the first and second cells, and wherein the current source is disposed adjacent to the first and second cells.

24. A semiconductor integrated device which drives current through first and second signal lines which are terminated at a given impedance Z0 and form a differential pair, the semiconductor integrated device comprising:

first and second pads through which current is driven exclusively in a signal-output period, the first and second pads being connected to the first and second signal lines, respectively;

a third pad through which current is driven in a period other than the signal-output period;

a current source connected between a first power supply and a given node;

first and second transistors which electrically connect the node with one of the first and second pads in the signal-output period;

a third transistor which electrically connects the node with the third pad in a period other than the signal-output period;

a first load element which is connected between a first transmission signal line connecting the first transistor with the first pad and a second power supply, and has an impedance substantially equal to the impedance Z0; and a second load element which is connected between a second transmission signal line connecting the second transistor with the second pad and a second power supply, and has an impedance substantially equal to the impedance Z0; and a third load element which is connected between a third transmission signal line connecting the third transistor with the third pad and a second power supply, and has an impedance substantially equal to the impedance Z0, wherein at least one of the first to third transistors is an n-type MOS transistor, wherein a signal transmitted through the first and second signal lines is a signal conforming to the Universal Serial Bus (USB) standard, wherein the third pad is disposed between the first and second pads and terminated at an impedance substantially equal to the impedance Z0 outside the semiconductor integrated device, wherein the first transistor is inserted between the node and the first pad and has an impedance substantially equal to the impedance Z0/2 when the first transistor is turned on, wherein the second transistor is inserted between the node and the second pad and has an impedance substantially equal to the impedance Z0/2 when the second transistor is turned on, wherein the third transistor is inserted between the node and the third pad and has an impedance substantially equal to the impedance Z0/2 when the third transistor is turned on, wherein a first cell including the first transistor connected to the first pad and a second cell including the second transistor connected to the second pad are disposed so that parasitic loads on an interconnect and a transistor connected to each of the first and second pads are substantially equal between the first and second cells, and wherein the current source is disposed adjacent to the first and second cells.

25. A semiconductor integrated device which drives current through first and second signal lines which are terminated at a given impedance Z0 and form a differential pair, the semiconductor integrated device comprising:

first and second pads through which current is driven exclusively in a signal-output period, the first and second pads being connected to the first and second signal lines, respectively;

a current source connected between a first power supply and a given node;

first and second transistors which electrically connect the node with one of the first and second pads in the signal-output period;

a third transistor which electrically connects the node with a second power supply in a period other than the signal-output period;

a first load element which is connected between a first transmission signal line connecting the first transistor with the first pad and a second power supply, and has an impedance substantially equal to the impedance Z0; and a second load element which is connected between a second transmission signal line connecting the second transistor with the second pad and a second power supply, and has an impedance substantially equal to the impedance Z0; and a third load element which is inserted between the third transistor and the second power supply and has an impedance substantially equal to the impedance Z0/2, wherein at least one of the first to third transistors is an n-type MOS transistor, wherein a signal transmitted through the first and second signal lines is a signal conforming to the Universal Serial Bus (USB) standard, wherein the first transistor is inserted between the node and the first pad and has an impedance substantially equal to the impedance Z0/2 when the first transistor is turned on, wherein the second transistor is inserted between the node and the second pad and has an impedance substantially equal to the impedance Z0/2 when the second transistor is turned on, wherein the third transistor has an impedance substantially equal to the impedance Z0/2 when the third transistor is turned on, wherein a first cell including the first transistor connected to the first pad and a second cell including the second transistor connected to the second pad are disposed so that parasitic loads on an interconnect and a transistor connected to each of the first and second pads are substantially equal between the first and second cells, and wherein the current source is disposed adjacent to the first and second cells.

26. Electronic equipment comprising:
the semiconductor integrated device as defined in claim 1; and
a device which performs output processing, fetch processing, or storage processing on data transferred through the semiconductor integrated device and a bus.

27. Electronic equipment comprising:
the semiconductor integrated device as defined in claim 21; and
a device which performs output processing, fetch processing, or storage processing on data transferred through the semiconductor integrated device and a bus.

28. Electronic equipment comprising:
the semiconductor integrated device as defined in claim 22; and
a device which performs output processing, fetch processing, or storage processing on data transferred through the semiconductor integrated device and a bus.

29. Electronic equipment comprising:
the semiconductor integrated device as defined in claim 23; and
a device which performs output processing, fetch processing, or storage processing on data transferred through the semiconductor integrated device and a bus.

30. Electronic equipment comprising:
the semiconductor integrated device as defined in claim 24; and
a device which performs output processing, fetch processing, or storage processing on data transferred through the semiconductor integrated device and a bus.

31. Electronic equipment comprising:
the semiconductor integrated device as defined in claim 25; and
a device which performs output processing, fetch processing, or storage processing on data transferred through the semiconductor integrated device and a bus.

* * * * *